(12) United States Patent
Torrione et al.

(10) Patent No.: US 10,683,744 B2
(45) Date of Patent: Jun. 16, 2020

(54) METHOD AND SYSTEM FOR DETECTING AT LEAST ONE OF AN INFLUX EVENT AND A LOSS EVENT DURING WELL DRILLING

(71) Applicant: PASON SYSTEMS CORP., Calgary (CA)

(72) Inventors: Peter Torrione, Calgary (CA); Kenneth Morton, Calgary (CA); Sean Unrau, Calgary (CA)

(73) Assignee: PASON SYSTEMS CORP. (CA)

(*) Notice: Subject to any disclaimer, the term of this patent is extended or adjusted under 35 U.S.C. 154(b) by 315 days.

(21) Appl. No.: 15/518,453

(22) PCT Filed: Sep. 1, 2016

(86) PCT No.: PCT/CA2016/051040
§ 371 (c)(1),
(2) Date: Apr. 11, 2017

(87) PCT Pub. No.: WO2017/035658
PCT Pub. Date: Mar. 9, 2017

(65) Prior Publication Data
US 2017/0314382 A1    Nov. 2, 2017

Related U.S. Application Data

(60) Provisional application No. 62/213,036, filed on Sep. 1, 2015.

(51) Int. Cl.
*E21B 47/00* (2012.01)
*E21B 47/10* (2012.01)
*E21B 21/08* (2006.01)

(52) U.S. Cl.
CPC .......... *E21B 47/0003* (2013.01); *E21B 21/08* (2013.01); *E21B 47/10* (2013.01)

(58) Field of Classification Search
None
See application file for complete search history.

(56) References Cited

U.S. PATENT DOCUMENTS 4,840,016 A    6/1989 Peltier
4,840,061 A  * 6/1989 Peltier ..................... E21B 21/08
                                                                73/1.34

(Continued)

FOREIGN PATENT DOCUMENTS

CA    2474998 A1    8/2003

OTHER PUBLICATIONS

B.A. Tarr et al., "Next Generation Kick Detection during Connections: Influx Detection at Pumps Stop (IDAPS) Software", SPE GCS Annual Drilling Symposium, Apr. 14, 2016.

(Continued)

*Primary Examiner* — Kibrom K Gebresilassie
*Assistant Examiner* — Michael Edward Cocchi
(74) *Attorney, Agent, or Firm* — Katten Muchin Rosenman LLP

(57) ABSTRACT

Methods, systems, and techniques for detecting at least one of an influx event and a loss event during well drilling involve using one or both of errors between 1) estimated and measured pit volume, and 2) estimated and measured flow out, to identify or determine whether the influx or loss event is occurring, or to sound some other type of related alert. These determinations may be performed in a computationally efficient manner, such as by using one or both of a time and depth sensitive regression.

21 Claims, 16 Drawing Sheets

(56) References Cited

U.S. PATENT DOCUMENTS

| | | | |
|---|---|---|---|
| 5,063,776 | A | 11/1991 | Zanker et al. |
| 5,205,166 | A | 4/1993 | McCann et al. |
| 5,237,539 | A | 8/1993 | Selman |
| 5,354,956 | A | 10/1994 | Orban et al. |
| 5,952,569 | A | 9/1999 | Jervis et al. |
| 6,152,246 | A | 11/2000 | King et al. |
| 6,220,087 | B1 | 4/2001 | Hache et al. |
| 6,234,250 | B1 | 5/2001 | Green et al. |
| 6,484,816 | B1 | 11/2002 | Koederitz |
| 6,618,322 | B1 | 9/2003 | Georgi |
| 6,755,261 | B2 | 6/2004 | Koederitz |
| 6,820,702 | B2 | 11/2004 | Niedermayr et al. |
| 6,823,950 | B2 | 11/2004 | von Eberstein, Jr. et al. |
| 6,868,920 | B2 | 3/2005 | Hoteit et al. |
| 6,892,812 | B2 | 5/2005 | Niedermayr et al. |
| 7,562,723 | B2 | 7/2009 | Reitsma |
| 7,762,131 | B2 | 7/2010 | Ibrahim et al. |
| 7,832,500 | B2 | 11/2010 | Garcia et al. |
| 8,060,311 | B2 | 11/2011 | Ramshaw et al. |
| 8,215,417 | B2 | 7/2012 | Annaiyappa et al. |
| 8,381,838 | B2 | 2/2013 | Hutniak et al. |
| 8,457,897 | B2 | 6/2013 | Hehmeyer |
| 8,528,660 | B2 | 9/2013 | Santos |
| 8,615,082 | B1 | 12/2013 | Selman et al. |
| 9,019,118 | B2 | 4/2015 | Milne et al. |
| 9,033,064 | B2 | 5/2015 | Koederitz |
| 9,255,473 | B2 | 2/2016 | Burress et al. |
| 9,394,783 | B2 | 7/2016 | Rasmus et al. |
| 2005/0222772 | A1 | 10/2005 | Koederitz et al. |
| 2007/0185696 | A1 | 8/2007 | Moran et al. |
| 2011/0042076 | A1* | 2/2011 | Reitsma ............... E21B 21/08 166/250.01 |
| 2011/0220350 | A1 | 9/2011 | Daccord et al. |
| 2012/0097823 | A1 | 4/2012 | Murray et al. |
| 2012/0123756 | A1 | 5/2012 | Wang et al. |
| 2012/0139747 | A1 | 6/2012 | Papouras et al. |
| 2013/0014991 | A1 | 1/2013 | Leuchtenberg |
| 2013/0090854 | A1 | 4/2013 | Rasmus et al. |
| 2013/0325351 | A1 | 12/2013 | Haberer et al. |
| 2014/0076632 | A1 | 3/2014 | Wessling et al. |
| 2014/0129148 | A1 | 5/2014 | Harmer et al. |
| 2014/0246238 | A1 | 9/2014 | Abbassian et al. |
| 2014/0291023 | A1 | 10/2014 | Edbury et al. |
| 2014/0326505 | A1 | 11/2014 | Davis et al. |
| 2014/0343694 | A1 | 11/2014 | Aldred et al. |
| 2014/0345940 | A1* | 11/2014 | Milner ............... E21B 44/00 175/24 |
| 2015/0083494 | A1 | 3/2015 | Noske et al. |
| 2015/0129306 | A1 | 5/2015 | Coffman |
| 2015/0235544 | A1* | 8/2015 | Hernandez ............ E21B 44/00 340/853.1 |

OTHER PUBLICATIONS

Pit Volume Totalizer Brochure, Pason, DOCU018 EN PVT Brochure (rev 5).

"Blowout Prevention Equipment Systems for Drilling Wells"—API Standard 53, Fourth Edition Draft; American Petroleum Institute.

D.J. Bode et al., "Well-Control Methods and Practices in Small-Diameter Wellbores", Amoco Production Co.; pp. 1380-1386, JPT, Nov. 1991.

Laureate (TM) 6-Digit Process Meter & Flow Totalizer—Laurel (TM) Electronics Inc., retrieved from <http://www.laurels.com/v-to-f.html> on Sep. 24, 2014.

International Search Report for International Application No. PCT/CA2016/051040 dated Oct. 7, 2016.

* cited by examiner

METHOD AND SYSTEM FOR DETECTING AT LEAST ONE OF AN INFLUX EVENT AND A LOSS EVENT DURING WELL DRILLING

CROSS-REFERENCE TO RELATED APPLICATION

Pursuant to 35 U.S.C. § 119(e), the present application claims priority to U.S. provisional patent application No. 62/213,036 entitled "Method and System for Detecting at Least One of an Influx Event and a Loss Event During Well Drilling", the entirety of which is hereby incorporated by reference.

TECHNICAL FIELD

The present disclosure is directed at methods, systems, and techniques for detecting at least one of an influx event and a loss event during well drilling.

BACKGROUND

During conventional oil and gas well drilling, a drill bit attached to one end of a drill string is rotated into and through a formation in order to drill the well. Drilling fluid, also known as "drilling mud", is pumped through the drill string and into the well to provide lubrication, to flush away drill cuttings, and to counter the pressure of formation fluid. Examples of formation fluid comprise oil, gas, and water.

In some situations, however, the pressure of the drilling fluid against the annular surface of the well ("drilling fluid pressure") substantially differs from the opposing pressure of the formation fluid ("formation fluid pressure"). If the drilling fluid pressure is too low relative to the formation fluid pressure, formation fluid may enter the well; this is referred to as an "influx event" or a "kick". In certain situations, an influx event may lead to a blowout, which is potentially a devastating drilling event.

If the drilling fluid pressure is too high, it can overcome the fracture strength of the formation, which can result in loss of drilling fluid to the formation; this loss of drilling fluid is referred to as a "loss event". A loss event can consequently reduce the drilling fluid pressure, which may result in an influx event.

Given that both influx and loss events may lead to a blowout, there exists continued research and development into methods, systems, and techniques for detecting influx and loss events.

SUMMARY

According to a first aspect, there is provided a method for detecting at least one of an influx event and a loss event during well drilling, the method comprising (a) determining (i) a pit volume difference between estimated pit volume and measured pit volume; (ii) whether the magnitude of the pit volume difference exceeds an influx event threshold and the measured pit volume exceeds the estimated pit volume; and (iii) whether the magnitude of the pit volume difference exceeds a loss event threshold and the estimated pit volume exceeds the measured pit volume; (b) when the magnitude of the pit volume difference exceeds an influx event threshold and the measured pit volume exceeds the estimated pit volume, identifying the influx event as occurring; (c) when the magnitude of the pit volume difference exceeds a loss event threshold and the estimated pit volume exceeds the measured pit volume, identifying the loss event as occurring, wherein the estimated pit volume comprises a time sensitive regression.

The estimated pit volume may further comprise a depth sensitive regression. Alternatively, the estimated pit volume may comprise the depth sensitive regression and not the time sensitive regression.

A first estimated pit volume may be used to identify the influx event and a second estimated pit volume may be used to identify the loss event. The first estimated pit volume may be determined as a trailing minimum of the measured pit volume and the second estimated pit volume may be determined as a trailing maximum of the measured pit volume.

According to another aspect, there is provided a method for detecting at least one of an influx event and a loss event during well drilling, the method comprising (a) determining (i) a pit volume difference between estimated pit volume and measured pit volume; (ii) whether the magnitude of the pit volume difference exceeds an influx event threshold and the measured pit volume exceeds the estimated pit volume; (iii) whether the magnitude of the pit volume difference exceeds a loss event threshold and the estimated pit volume exceeds the measured pit volume; (b) when the magnitude of the pit volume difference exceeds an influx event threshold and the measured pit volume exceeds the estimated pit volume, identifying the influx event as occurring; and (c) when the magnitude of the pit volume difference exceeds a loss event threshold and the estimated pit volume exceeds the measured pit volume, identifying the loss event as occurring, wherein the estimated pit volume is determined from a difference between a sum of flow out measurements and a sum of flow in measurements. Each of these sums may comprise an integral of flow measurements.

The flow in measurements that are summed may take into account the time for drilling fluid to travel from a mud tank to an input flow meter.

The flow out measurements that are summed may take into account the time for drilling fluid to travel from a return flow meter to a mud tank.

According to another aspect, there is provided a method for detecting at least one of an influx event and a loss event during well drilling, the method comprising (a) determining (i) a flow estimate difference between estimated flow out and measured flow out; (ii) whether the magnitude of the flow estimate difference exceeds an influx event threshold and the measured flow out exceeds the estimated flow out; (iii) the magnitude of the flow estimate difference exceeds a loss event threshold and the estimated flow out exceeds the measured flow out; (b) when the magnitude of the flow estimate difference exceeds an influx event threshold and the measured flow out exceeds the estimated flow out, identifying the influx event as occurring; and (c) when the magnitude of the flow estimate difference exceeds a loss event threshold and the estimated flow out exceeds the measured flow out, identifying the loss event as occurring, wherein the estimated flow out comprises a sum of measured flow in readings measured during or around one or both of pump on and off transient events. Any one or more of the measured flow readings may be scaled prior to being summed.

The estimated flow out may further comprise a sum of scaled readings based on changes in bit depth compared to hole depth.

According to another aspect, there is provided a method for detecting at least one of an influx event and a loss event during well drilling, the method comprising (a) determining (i) a pit volume difference between estimated pit volume and measured pit volume; (ii) a flow estimate difference between estimated flow out and measured flow out; (iii) whether the magnitude of the pit volume difference exceeds an influx event threshold and the measured pit volume exceeds the estimated pit volume and when the magnitude of the flow estimate difference exceeds an influx event threshold and the measured flow out exceeds the estimated flow out; and (iv) whether the magnitude of the pit volume difference exceeds a loss event threshold and the estimated pit volume exceeds the measured pit volume and when the magnitude of the flow estimate difference exceeds a loss event threshold and the estimated flow out exceeds the measured flow out; (b) when the magnitude of the pit volume difference exceeds an influx event threshold and the measured pit volume exceeds the estimated pit volume and when the magnitude of the flow estimate difference exceeds an influx event threshold and the measured flow out exceeds the estimated flow out, identifying the influx event as occurring; and (c) when the magnitude of the pit volume difference exceeds a loss event threshold and the estimated pit volume exceeds the measured pit volume and when the magnitude of the flow estimate difference exceeds a loss event threshold and the estimated flow out exceeds the measured flow out, identifying the loss event as occurring, wherein the estimated pit volume comprises a time sensitive regression and wherein the estimated flow out comprises a sum of scaled and measured flow in readings measured during or around one or both of pump on and off transient events.

According to another aspect, there is provided a method for detecting at least one of an influx event and a loss event during well drilling involve using one or both of errors between 1) estimated and measured pit volume, the estimated pit volume being determined in accordance with any aspect or embodiment for estimating pit volume as described in this disclosure, and 2) estimated and measured flow out, the estimated flow out being determined in accordance with any aspect or embodiment for estimating pit volume as described in this disclosure.

According to another aspect, there is provided a method for detecting at least one of an influx event and a loss event during well drilling. The method comprises (a) determining, using a processor, an estimated pit volume, wherein the processor determines the estimated pit volume as one of a value less than or equal to a trailing median of a measured pit volume and a value greater than or equal to the trailing median of the measured pit volume; (b) determining, using the processor, a pit volume difference between the estimated pit volume and a measured pit volume, and (i) when the processor determines the estimated pit volume as the value less than or equal to the trailing median, whether the magnitude of the pit volume difference exceeds an influx event threshold and the measured pit volume exceeds the estimated pit volume; and (ii) when the processor determines the estimated pit volume as the value greater than or equal to the trailing median, whether the magnitude of the pit volume difference exceeds a loss event threshold and the estimated pit volume exceeds the measured pit volume; (c) when the processor determines that the magnitude of the pit volume difference exceeds the influx event threshold and the measured pit volume exceeds the estimated pit volume, identifying the influx event as occurring; and (d) when the processor determines that the magnitude of the pit volume difference exceeds the loss event threshold and the estimated pit volume exceeds the measured pit volume, identifying the loss event as occurring.

The estimated pit volume may be determined as the value less than or equal to the trailing median of the pit volume.

The value less than or equal to the trailing median of the pit volume may be less than or equal to a 15% order statistic of the pit volume.

The estimated pit volume may be determined as the trailing minimum of the measured pit volume.

The estimated pit volume may be determined as the value greater than or equal to the trailing median of the pit volume.

The value greater than or equal to the trailing median of the pit volume may be greater than or equal to an 85% order statistic of the pit volume.

The estimated pit volume may be determined as the trailing maximum of the measured pit volume.

The method may further comprise (a) determining, using the processor, an additional estimated pit volume as the other of the trailing minimum and the trailing maximum of the measured pit volume; (b) determining, using the processor, an additional pit volume difference between the additional pit volume and the measured pit volume, and (i) when the processor determines the additional estimated pit volume as the trailing minimum, whether the magnitude of the additional pit volume difference exceeds the influx event threshold and the measured pit volume exceeds the additional estimated pit volume; and (ii) when the processor determines the additional estimated pit volume as the trailing maximum, whether the magnitude of the additional pit volume difference exceeds the loss event threshold and the additional estimated pit volume exceeds the measured pit volume; (c) when the processor determines that the magnitude of the additional pit volume difference exceeds the influx event threshold and the measured pit volume exceeds the additional estimated pit volume, identifying the influx event as occurring; and (d) when the processor determines that the magnitude of the additional pit volume difference exceeds the loss event threshold and the additional estimated pit volume exceeds the measured pit volume, identifying the loss event as occurring.

According to another aspect, there is provided a method for detecting at least one of an influx event and a loss event during well drilling. The method comprises (a) determining, using a processor, an estimated flow out, wherein the estimated flow out comprises a sum of scaled and historical measured flow in readings, wherein weights used to scale the measured flow in readings are determined using the measured flow in readings measured during or around one or both of pump on and off transient events; (b) determining, using the processor, a flow out difference between the estimated flow out and measured flow out, and at least one of (i) whether the magnitude of the flow out difference exceeds an influx event threshold and the measured flow out exceeds the estimated flow out; and (ii) whether the magnitude of the flow out difference exceeds a loss event threshold and the estimated flow out exceeds the measured flow out; (c) when the processor determines that the flow out difference exceeds the influx event threshold and the measured flow out exceeds the estimated flow out, identifying the influx event as occurring; and (d) when the processor determines that the flow out difference exceeds the loss event threshold and the estimated flow out exceeds the measured flow out, identifying the loss event as occurring.

The processor may determine whether the magnitude of the flow out difference exceeds the influx event threshold and the measured flow out exceeds the estimated flow out, and not whether the magnitude of the flow out difference exceeds the loss event threshold and the estimated flow out exceeds the measured flow out.

The processor may determine whether the magnitude of the flow out difference exceeds the loss event threshold and the estimated flow out exceeds the measured flow out, and not whether the magnitude of the flow out difference exceeds the influx event threshold and the measured flow out exceeds the estimated flow out.

The processor may determine whether the magnitude of the flow out difference exceeds the influx event threshold and the measured flow out exceeds the estimated flow out, and whether the magnitude of the flow out difference exceeds the loss event threshold and the estimated flow out exceeds the measured flow out.

The weights may be determined from the measured flow in readings measured within five minutes of one or both of pump on and off transient events.

The weights may be determined using a time sensitive regression.

The time sensitive regression may be a linear regression.

The estimated flow out may further comprise a sum of scaled and historical readings of changes with respect to time of a difference between hole depth and bit depth.

The weights used to scale the readings of changes with respect to time of the difference between hole depth and bit depth may be determined during or around events during which bit depth changes while hole depth stays constant.

The weights used to scale the readings of changes with respect to time of the difference between hole depth and bit depth may be determined within five minutes of events during which bit depth changes while hole depth stays constant.

The weights used to scale the readings of changes with respect to time of the difference between hole depth and bit depth may be determined using a time sensitive regression.

The time sensitive regression may be a linear regression.

The weights may also be determined using measured flow in readings measured during times other than during or around one or both of pump on and off transient events.

According to another aspect, there is provided a method for detecting at least one of an influx event and a loss event during well drilling. The method comprises (a) determining, using a processor, an estimated pit volume, wherein the processor determines the estimated pit volume by using historical flow in measurements; (b) determining, using the processor, a pit volume difference between estimated pit volume and measured pit volume, and at least one of (i) whether the magnitude of the pit volume difference exceeds an influx event threshold and the measured pit volume exceeds the estimated pit volume; and (ii) whether the magnitude of the pit volume difference exceeds a loss event threshold and the estimated pit volume exceeds the measured pit volume; (c) when the processor determines that the magnitude of the pit volume difference exceeds the influx event threshold and the measured pit volume exceeds the estimated pit volume, identifying the influx event as occurring; and (d) when the processor determines that the magnitude of the pit volume difference exceeds the loss event threshold and the estimated pit volume exceeds the measured pit volume, identifying the loss event as occurring.

The estimated pit volume may comprise a difference between a sum of historical flow out measurements and a sum of historical flow in measurements.

The flow in measurements that are summed may be compensated for the time for drilling fluid to travel from a mud tank to an input flow meter.

The flow in measurements that are summed may be compensated for the time for drilling fluid to travel from a mud tank to an input flow meter.

The flow out measurements that are summed may be compensated for the time for drilling fluid to travel from a return flow meter to a mud tank.

The historical flow in and flow out measurements may correspond to flow in and flow out during or around one or both of pump on and off transient events.

The historical flow in and flow out measurements may correspond to flow in and flow out within five minutes of one or both of pump on and off transient events.

The processor may determine the estimated pit volume by determining a sum of scaled and historical measured readings of changes with respect to time of flow in, wherein weights used to scale the readings of changes with respect to time of flow in are determined from measured flow in readings measured during or around one or both of pump on and off transient events; and summing the sum of scaled and historical measured readings of changes with respect to time of flow in to determine the estimated pit volume.

The weights may be determined from measured flow in readings measured within five minutes of one or both of pump on and off transient events.

The weights may be determined using a time sensitive regression.

The regression may be a linear regression.

According to another aspect, there is provided a method for detecting at least one of an influx event and a loss event during well drilling. The method comprises (a) determining, using a processor (i) an estimated pit volume and an estimated flow out, wherein the estimated flow out comprises a sum of scaled and historical measured flow in readings, wherein weights used to scale the measured flow in readings are determined using the measured flow in readings measured during or around one or both of pump on and off transient events; (ii) a pit volume difference between the estimated pit volume and a measured pit volume; (iii) a flow out difference between the estimated flow out and a measured flow out; (iv) at least one of (1) whether the magnitude of the pit volume difference exceeds a pit volume influx event threshold, the measured pit volume exceeds the estimated pit volume, the magnitude of the flow estimate difference exceeds a flow out influx event threshold, and the measured flow out exceeds the estimated flow out; and (2) whether the magnitude of the pit volume difference exceeds a pit volume loss event threshold, the estimated pit volume exceeds the measured pit volume, the magnitude of the flow out difference exceeds a flow out loss event threshold, and the estimated flow out exceeds the measured flow out; (b) when the processor determines that the magnitude of the pit volume difference exceeds the pit volume influx event threshold, the measured pit volume exceeds the estimated pit volume, the magnitude of the flow estimate difference exceeds the flow out influx event threshold, and the measured flow out exceeds the estimated flow out, identifying the influx event as occurring; and (c) when the magnitude of the pit volume difference exceeds the pit volume loss event threshold, the estimated pit volume exceeds the measured pit volume, the magnitude of the flow out difference exceeds the flow out loss event threshold, and the estimated flow out exceeds the measured flow out, identifying the loss event as occurring.

The processor may determine whether the magnitude of the pit volume difference exceeds a pit volume influx event threshold, the measured pit volume exceeds the estimated pit volume, the magnitude of the flow estimate difference exceeds a flow out influx event threshold, and the measured flow out exceeds the estimated flow out, and not whether the magnitude of the pit volume difference exceeds a pit volume loss event threshold, the estimated pit volume exceeds the measured pit volume, the magnitude of the flow out difference exceeds a flow out loss event threshold, and the estimated flow out exceeds the measured flow out.

The processor may determine whether the magnitude of the pit volume difference exceeds a pit volume loss event threshold, the estimated pit volume exceeds the measured pit volume, the magnitude of the flow out difference exceeds a flow out loss event threshold, and the estimated flow out exceeds the measured flow out, and not whether the magnitude of the pit volume difference exceeds a pit volume influx event threshold, the measured pit volume exceeds the estimated pit volume, the magnitude of the flow estimate difference exceeds a flow out influx event threshold, and the measured flow out exceeds the estimated flow out.

The processor may determine whether the magnitude of the pit volume difference exceeds a pit volume influx event threshold, the measured pit volume exceeds the estimated pit volume, the magnitude of the flow estimate difference exceeds a flow out influx event threshold, and the measured flow out exceeds the estimated flow out, and whether the magnitude of the pit volume difference exceeds a pit volume loss event threshold, the estimated pit volume exceeds the measured pit volume, the magnitude of the flow out difference exceeds a flow out loss event threshold, and the estimated flow out exceeds the measured flow out.

The weights may be determined from the measured flow in readings measured within five minutes of one or both of pump on and off transient events.

The weights may be determined using a time sensitive regression.

The time sensitive regression may be a linear regression.

The estimated flow out may further comprise a sum of scaled and historical readings of changes with respect to time of a difference between hole depth and bit depth.

The weights used to scale the readings of changes with respect to time of the difference between hole depth and bit depth may be determined during or around events during which bit depth changes while hole depth stays constant.

The weights used to scale the readings of changes with respect to time of the difference between hole depth and bit depth may be determined within five minutes of events during which bit depth changes while hole depth stays constant.

The weights used to scale the readings of changes with respect to time of the difference between hole depth and bit depth may be determined using a time sensitive regression.

The time sensitive regression may be a linear regression.

The weights may also be determined using measured flow in readings measured during times other than during or around one or both of pump on and off transient events.

The processor may determine the estimated pit volume by applying a time sensitive regression.

The processor may determine the estimated pit volume by applying a depth sensitive regression.

The processor may determine the estimated pit volume by applying a time and depth sensitive regression.

Each of the time and depth sensitive regressions may be a linear regression.

The estimated pit volume may be determined as a sum of the depth sensitive regression and the time sensitive regression; each of the depth and time sensitive regressions may be linear; the depth sensitive regression may be determined from historical measurements of hole depth and the pit volume; and the time sensitive regression may be determined from historical values of the depth sensitive regression.

The time sensitive regression may be linear and determined from historical measurements of the pit volume.

The processor may determines the estimated pit volume as a value less than or equal to a trailing median of the measured pit volume, and the processor may use the estimated pit volume to identify the influx event as occurring.

The value less than or equal to the trailing median of the pit volume may be less than or equal to a 15% order statistic of the pit volume.

The estimated pit volume may be determined as the trailing minimum of the measured pit volume.

The processor may determine the estimated pit volume as a value greater than or equal to the trailing median of the measured pit volume, and the processor may use the estimated pit volume to identify the loss event as occurring.

The value greater than or equal to the trailing median of the pit volume may be greater than or equal to an 85% order statistic of the pit volume.

The estimated pit volume may be determined as the trailing maximum of the measured pit volume.

The processor may determine the estimated pit volume by using historical flow in measurements.

The estimated pit volume may comprise a difference between a sum of historical flow out measurements and a sum of historical flow in measurements.

The flow in measurements that are summed may be compensated for the time for drilling fluid to travel from a mud tank to an input flow meter.

The flow in measurements that are summed may be compensated for the time for drilling fluid to exit a mud tank as a result of a stroke of a mud pump.

The flow out measurements that are summed may be compensated for the time for drilling fluid to travel from a return flow meter to a mud tank.

The historical flow in and flow out measurements may correspond to flow in and flow out during or around one or both of pump on and off transient events.

The historical flow in and flow out measurements may correspond to flow in and flow out within five minutes of one or both of pump on and off transient events.

The processor may determine the estimated pit volume by determining a sum of scaled and historical measured readings of changes with respect to time of flow in, wherein weights used to scale the readings of changes with respect to time of flow in are determined from measured flow in readings measured during or around one or both of pump on and off transient events; and summing the sum of scaled and historical measured readings of changes with respect to time of flow in to determine the estimated pit volume.

The weights may be determined from measured flow in readings measured within five minutes of one or both of pump on and off transient events.

The weights may be determined using a time sensitive regression.

The time sensitive regression may be a linear regression.

According to another aspect, there is provided a method for detecting at least one of an influx event and a loss event during well drilling. The method comprises (a) determining, using a processor, an estimated pit volume, wherein the processor determines the estimated pit volume by applying at least one of a time and depth sensitive regression; (b) determining, using the processor, a pit volume difference between the estimated pit volume and a measured pit volume, and at least one of (i) whether the magnitude of the pit volume difference exceeds an influx event threshold and the measured pit volume exceeds the estimated pit volume; and (ii) whether the magnitude of the pit volume difference exceeds a loss event threshold and the estimated pit volume exceeds the measured pit volume; (c) when the processor determines that the magnitude of the pit volume difference exceeds the influx event threshold and the measured pit volume exceeds the estimated pit volume, identifying the influx event as occurring; and (d) when the processor determines that the magnitude of the pit volume difference exceeds the loss event threshold and the estimated pit volume exceeds the measured pit volume, identifying the loss event as occurring.

The processor may determine the estimated pit volume using the time sensitive regression and not the depth sensitive regression.

The processor may determine the estimated pit volume using the depth sensitive regression and not the time sensitive regression.

The processor may determine the estimated pit volume using the depth sensitive regression and the time sensitive regression.

The processor may determine whether the magnitude of the pit volume difference exceeds the influx event threshold and the measured pit volume exceeds the estimated pit volume, and not whether the magnitude of the pit volume difference exceeds the loss event threshold and the estimated pit volume exceeds the measured pit volume.

The processor may determine whether the magnitude of the pit volume difference exceeds the loss event threshold and the estimated pit volume exceeds the measured pit volume, and not whether the magnitude of the pit volume difference exceeds the influx event threshold and the measured pit volume exceeds the estimated pit volume.

The processor may determine whether the magnitude of the pit volume difference exceeds the influx event threshold and the measured pit volume exceeds the estimated pit volume, and whether the magnitude of the pit volume difference exceeds the loss event threshold and the estimated pit volume exceeds the measured pit volume.

Each of the time and depth sensitive regressions may be a linear regression.

The estimated pit volume may be determined as a sum of the depth sensitive regression and the time sensitive regression; each of the depth and time sensitive regressions may be a linear regression; the depth sensitive regression may be determined from historical measurements of hole depth and the pit volume; and the time sensitive regression may be determined from historical values of the depth sensitive regression.

The time sensitive regression may be linear and determined from historical measurements of the pit volume.

In any of the foregoing aspects of the method or suitable combinations thereof, the method may further comprise measuring one or more of pit volume, flow in, and flow out. These measurements may be performed using a volume meter that is connected to the mud tank (for pit volume measurements) and input and return flow meters located along fluid input and return lines, respectively (for flow measurements). Additionally or alternatively, flow in measurements may be performed by counting the number of strokes of the mud pump and multiplying that number by the mud pump's displacement per stroke while taking into account the volume of the fluid input line.

According to another aspect, there is provided a system for detecting at least one of an influx event and a loss event during well drilling, the system comprising a mud tank; a fluid input line fluidly coupling the mud tank to the well; a fluid return line fluidly coupling the mud tank to the well; a mud pump fluidly coupled to and located along the fluid input line for pumping drilling fluid from the mud tank into the well; an input flow meter fluidly coupled to and located along the fluid input line for measuring flow in of the drilling fluid into the well; a return flow meter fluidly coupled to and located along the fluid input line for measuring flow out of the drilling fluid into the mud tank; a volume meter affixed to the mud tank for measuring total pit volume of the drilling fluid stored in the mud tank; a data analysis device communicatively coupled to each of the input and return flow meters and to the volume meter, the data analysis device comprising a processor communicatively coupled to a memory, the memory have stored thereon program code that, when executed, causes the processor to perform the method of any of the above aspects or suitable combinations thereof. In this aspect, the data analysis device may measure input flow either directly using readings obtained by the input flow meter, or by counting the number of strokes of the mud pump and multiplying that number by the mud pump's displacement per stroke while taking into account the volume of the fluid input line.

According to another aspect, there is provided a system for detecting at least one of an influx event and a loss event during well drilling, the system comprising a mud tank; a fluid input line fluidly coupling the mud tank to the well; a fluid return line fluidly coupling the mud tank to the well; a mud pump fluidly coupled to and located along the fluid input line for pumping drilling fluid from the mud tank into the well; a return flow meter fluidly coupled to and located along the fluid input line for measuring flow out of the drilling fluid into the mud tank; a volume meter affixed to the mud tank for measuring total pit volume of the drilling fluid stored in the mud tank; a data analysis device communicatively coupled to each of the return flow meter, the mud pump, and to the volume meter, the data analysis device comprising a processor communicatively coupled to a memory, the memory have stored thereon program code that, when executed, causes the processor to perform the method of any of the above aspects or suitable combinations thereof. In this aspect, the data analysis device may measure input flow by counting the number of strokes of the mud pump and multiplying that number by the mud pump's displacement per stroke while taking into account the volume of the fluid input line. Through addition of an input flow meter, the data analysis device may additionally or alternatively measure input flow directly using readings obtained by the input flow meter.

According to another aspect, there is provided a non-transitory computer readable medium having encoded thereon program code that, when executed, causes a processor to perform the method of any of the above aspects or suitable combinations thereof.

This summary does not necessarily describe the entire scope of all aspects. Other aspects, features and advantages will be apparent to those of ordinary skill in the art upon review of the following description of specific embodiments.

BRIEF DESCRIPTION OF THE DRAWINGS

In the accompanying drawings, which illustrate one or more example embodiments:

FIG. 4 illustrates one embodiment of a method performed by one embodiment of the system for detecting at least one of an influx event and a loss event to determine the relationship between flow out and flow in.

DETAILED DESCRIPTION

Figure 1:
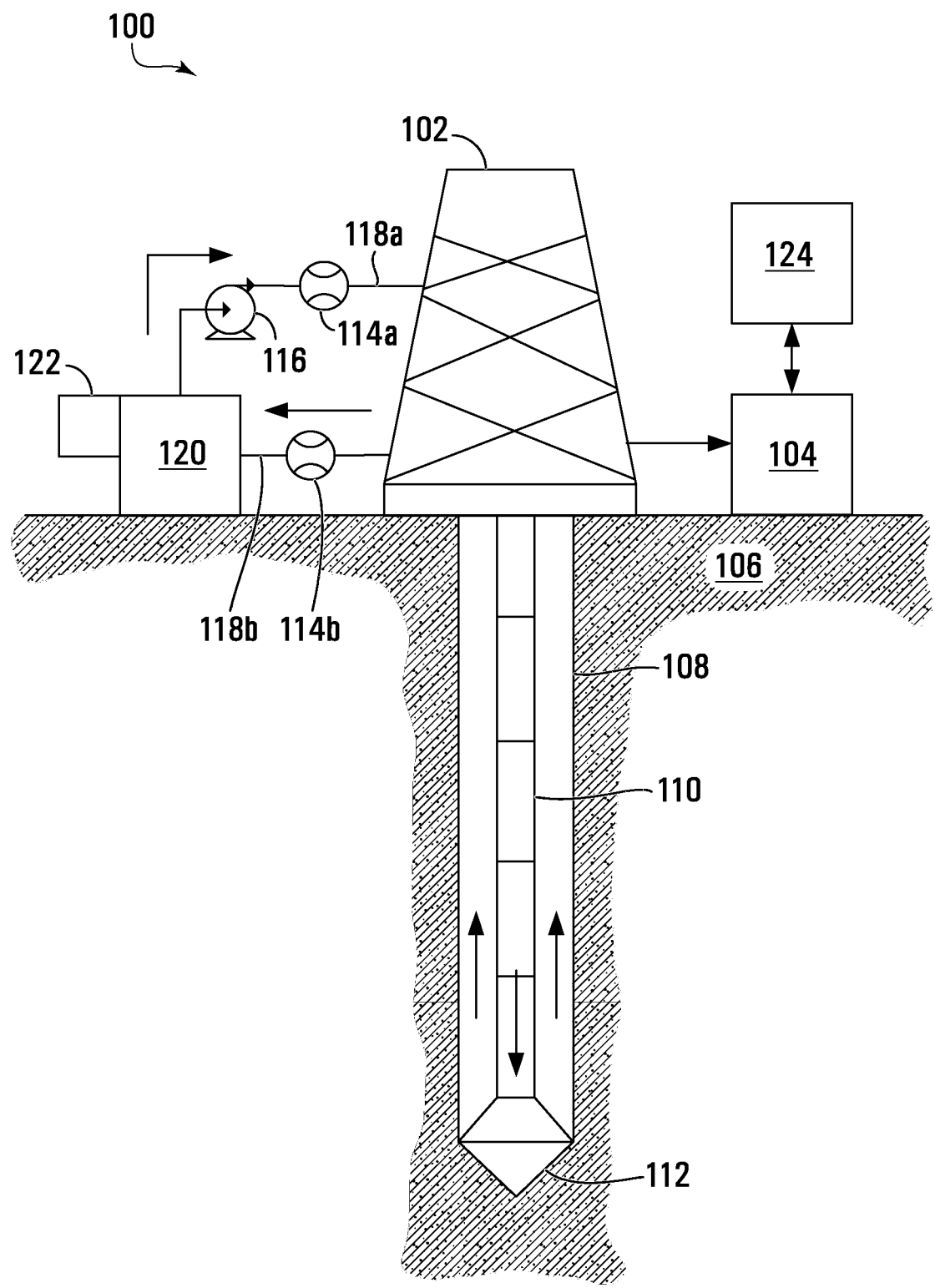
FIG. 1 is a diagram of a system for detecting at least one of an influx event and a loss event during well drilling, according to one embodiment.

Referring now to FIG. 1, there is shown a system 100 for detecting at least one of an influx event and a loss event during well drilling, according to one embodiment. The system 100 comprises a derrick 102 from which downwardly extends into a formation 106 a drill string 110 at the end of which is a drill bit 112. A top drive or kelly drive (not shown) suspended by the derrick 102 is rotatably coupled to the drill string 110 and operates to rotate the drill string 110 and, consequently, the drill bit 112. Rotation of the drill bit 112 through the formation 106 drills a well 108.

At surface, a reservoir 120 for drilling fluid (hereinafter interchangeably referred to as a "mud tank 120" or "mud pit 120") stores drilling fluid for pumping into the well 108 via the drill string 110. A volume meter 122 is affixed to the mud tank 120 and is used to measure the total volume of the drilling fluid stored in the mud tank 120 at any particular time (this volume is hereinafter interchangeably referred to as "pit volume"). A closed fluid circuit comprises the mud tank 120, a fluid input line 118a for sending the drilling fluid down the interior of the drill string 110 and subsequently into the annulus between the drill string and the annular surface of the well 108, and a fluid return line 118b for returning the drilling fluid from that annulus to the mud tank 120; the direction of drilling fluid flow along this closed fluid circuit is shown by arrows in FIG. 1. A mud pump 116 is fluidly coupled to and located along the fluid input line 118a and is used to pump the drilling fluid from the mud tank 120 into the drill string 110. An input flow meter 114a and a return flow meter 114b are fluidly coupled to and located along the fluid input line 118a and fluid return line 118b, respectively, and are used to monitor flow rates into and out of the well 108. While the depicted embodiment shows the input flow meter 114a, in a different embodiment (not shown) the flow through the fluid input line 118a may be determined differently. For example, the number of strokes of the mud pump 116 may be counted and multiplied by the mud pump's 116 displacement per stroke and the volume of the fluid input line 118a to arrive at the flow rate.

Also at surface is a data recording device 104, an example of which is the Pason Rig Display™. The data recording device 104 obtains sensor readings from various surface sensors such as the flow meters 114a,b and the volume meter 122 in addition to other surface sensors (not shown) and any downhole sensors, such as those comprising part of a measurement-while-drilling tool (not shown) that may comprise part of certain example embodiments. The sensor readings are stored as data points in a text file and may comprise readings such as the hole depth of the well 108; the rate of penetration of the drill bit 112; the depth of the drill bit 112; the on bottom rate of penetration of the drill bit 112 through the formation 106; the weight on the drill bit 112; the rotations per minute of the drill string 110 as measured at the surface; the rotary torque applied to the drill string 110 as measured at the surface; the total pump output of the pump 116 as measured by the input flow meter 114a ("flow in"); the total flow of drilling fluid out the well 108 and back to the mud tank 120 ("flow out"); and the pit volume. In different embodiments (not shown), the sensor readings may be stored in a different format, such as in a database. An example data recording device 104 may comprise a 19" touchscreen, 4 GB of random access memory, a 60 GB hard drive, and an Intel Core i7™ processor running at 1.5 GHz. The touchscreen and the enclosure comprising part of the data recording device 104 may be sufficiently rugged and durable to permit extended use at rig sites.

Figure 14:
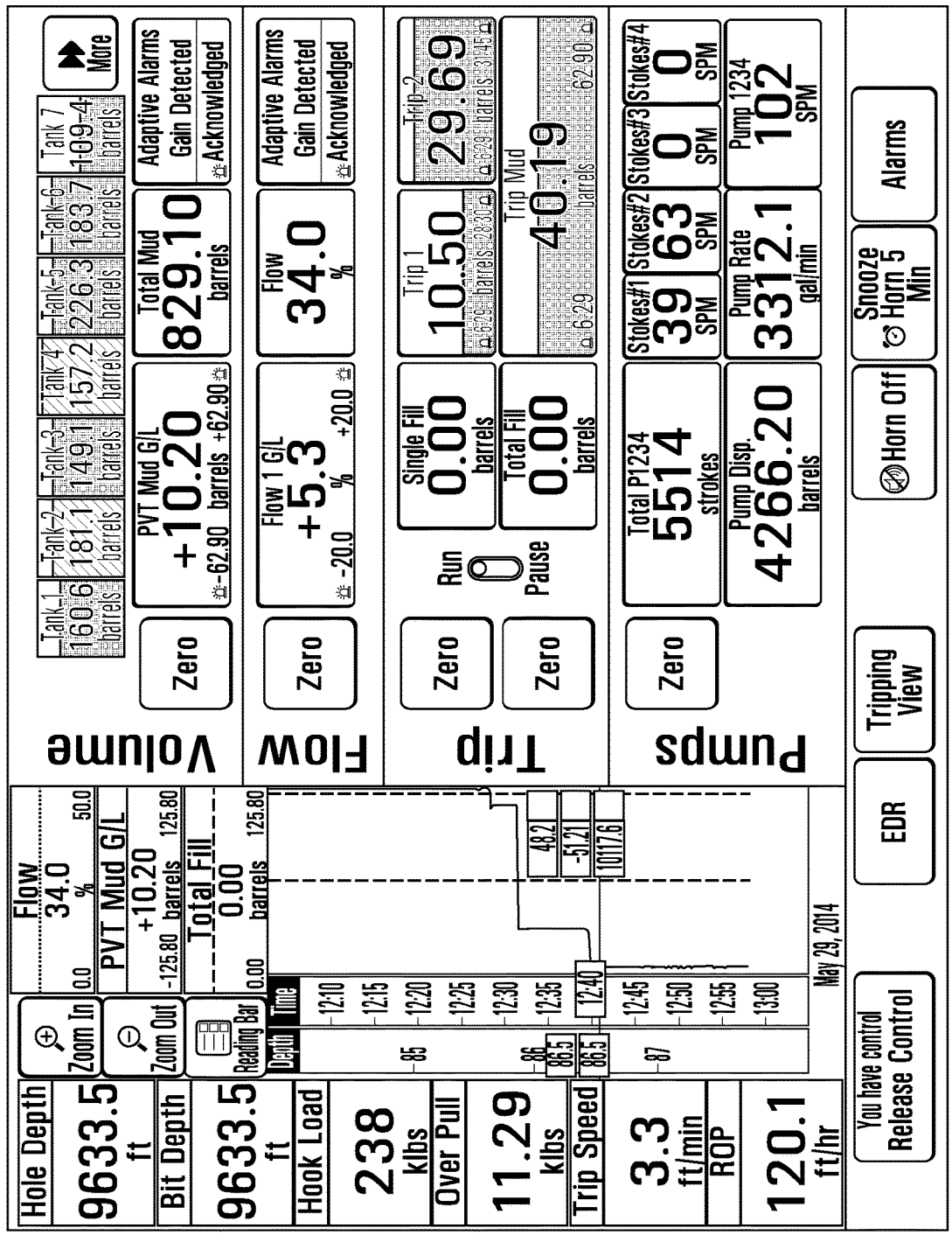
FIG. 14 shows an example user interface that may be displayed on an embodiment of the data analysis device comprising a touchscreen, according to another embodiment.

A data analysis device 124 is communicatively coupled to the data recording device 104 and is used to perform certain methods using the data obtained and recorded using the data recording device 104. More particularly and as described in further detail below, the data analysis device 124 determines whether at least one of a loss event and an influx event have occurred, taking into account parameters such as the flow out and pit volume. More particularly, certain embodiments described herein comprise computationally efficient techniques to estimate flow out and pit volume and to use those estimates to identify whether a loss or influx event is occurring. For example, certain embodiments apply one or both of a time and depth sensitive regression to computationally efficiently estimate pit volume and flow out. An example data analysis device 124 may comprise a 15" touchscreen, 2 GB of random access memory, a 16 GB SATA hard drive, and an Intel Core2Duo™ processor running at 1.5 GHz. The touchscreen and the enclosure comprising part of the data analysis device 124 may be sufficiently rugged and durable to permit extended use at rig sites. When used at rig sites, the data analysis device 124 may be located within the doghouse on the rig floor. An example user interface displayed on the touchscreen of the device 124 is depicted in FIG. 14.

While FIG. 1 depicts the data recording device 104 and data analysis device 124 as being distinct, different configurations are possible. Furthermore, while the depicted embodiment of the data recording device 104 stores sensor readings in a text file, in different embodiments (not depicted) different formats may be used to store those readings. In other embodiments (not depicted), the functionality of the devices 104,124 may be combined into a single device or distributed between three or more devices. Additionally or alternatively, some or all of the functionality of the data recording device 104 may be missing; for example, in one different embodiment, the system 100 may collect and analyze data using the data analysis device 124, but not store the data on a long term basis using the data recording device 104. As another example, one or both of the data recording device and data analysis device 104,124 may store data locally for one or more of display, analysis, and retrieval, but not send the data remotely via any type of network.

Mode Determination

As discussed in further detail below, in certain embodiments the analysis device 124 may apply different methods to determine whether one or both of a loss and influx event is occurring depending on the current drilling mode. By virtue of being connected to the recording device 104, the analysis device 124 has access to drilling parameters such as pump output and bit depth and uses those parameters to determine the current drilling mode. In the depicted example embodiment, the analysis device 124 determines the following modes using the following criteria:

(a) Pumps Circulating, Non-transient: flow in on, and flow in has been on for a minimum flow in period, such as five minutes or ten minutes, or longer;
(b) Pumps Off, Transient: flow in off and has been for less than the minimum flow in period;
(c) Pumps On, Transient: flow in on and has been for less than the minimum flow in period; and
(d) Idle: flow in off.

where "flow in on" refers to total pump output >0. As the above is an example list for one embodiment, different embodiments may use different criteria. For example, some example embodiments may additionally or alternatively use user specified criteria, such as whether tripping is occurring.

Figure 2A:
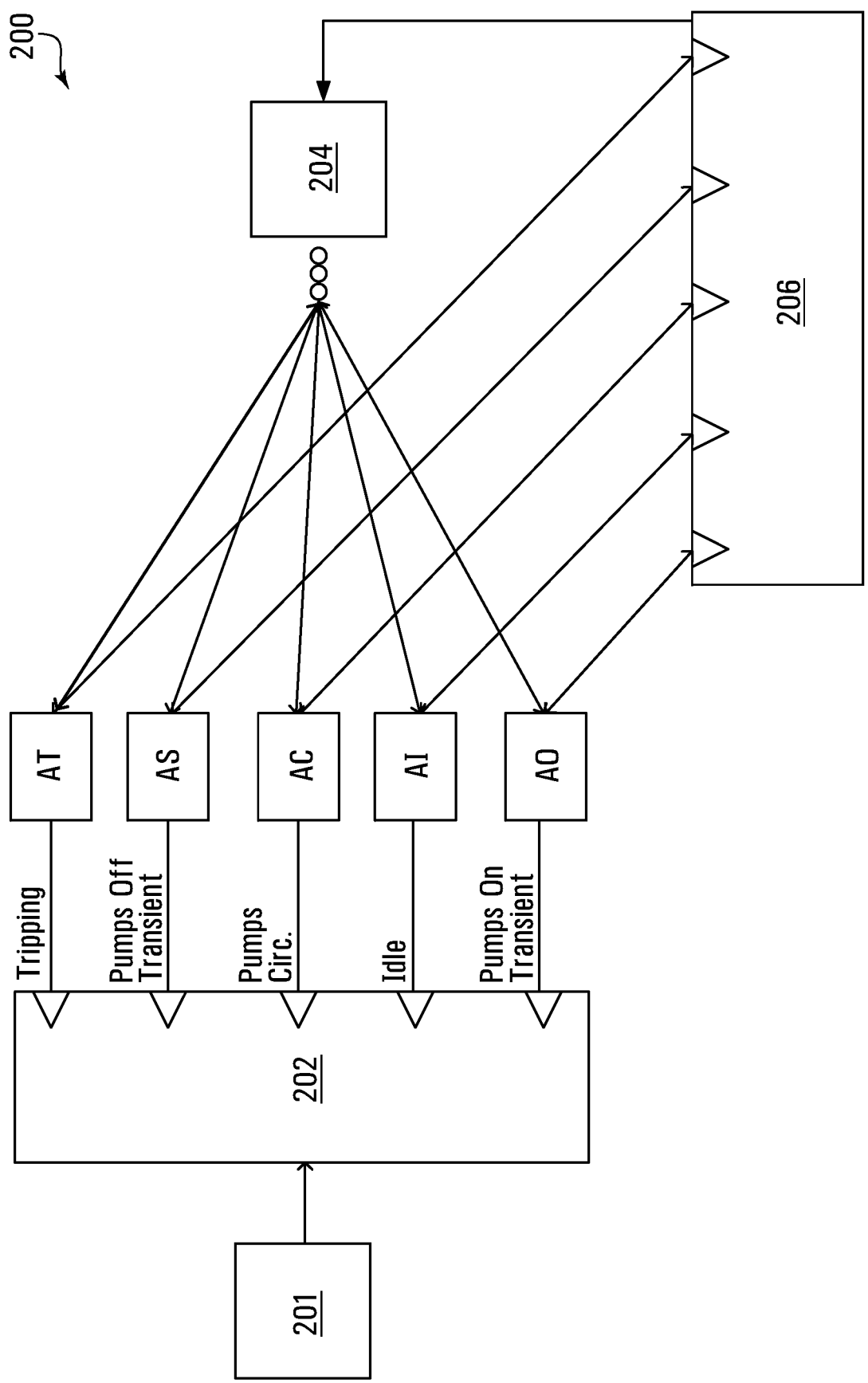
FIG. 2A is a graph showing the mode estimation results of the system of FIG. 2B.
Figure 2B:
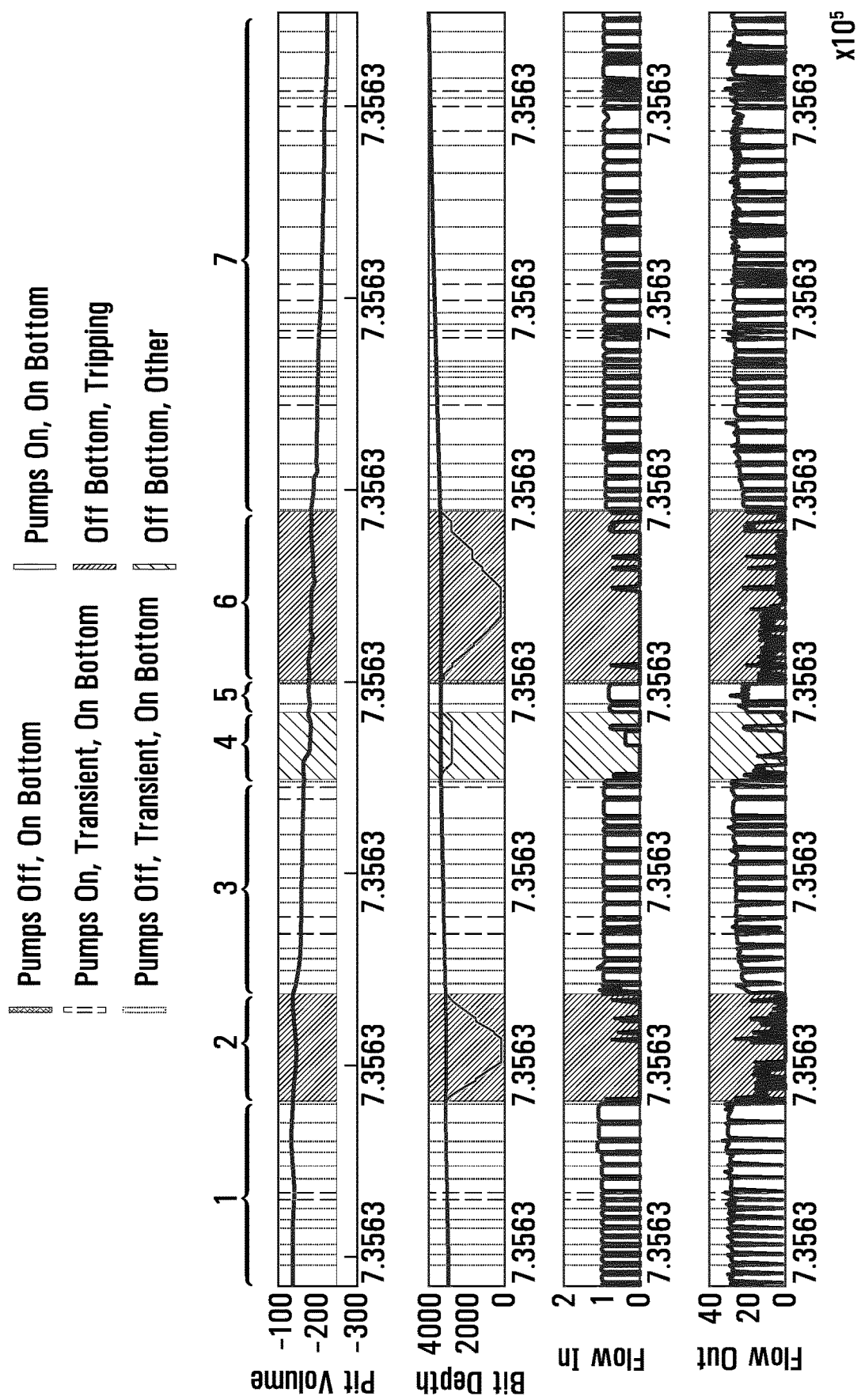
FIG. 2B a block diagram of one embodiment of a system for mode determination that comprises part of one embodiment of the system for detecting at least one of an influx event and a loss event during well drilling.

FIG. 2B shows a graph of the analysis device's 124 mode estimation results. In regions 1, 3, 5, and 7, generally the analysis device 124 determines that flow in is on and the drill bit 112 is on bottom and accordingly determines the mode as "pumps circulating", although intermittently the analysis device 124 also determines the mode to be in one of the pumps on or off transient states. In regions 2 and 6 the analysis device 124 determines that the mode is "tripping" in response to user input, such as through a user interface on the device 124. In region 4 the analysis device 124 determines that the mode is "partial tripping" or "reaming" also in response to user input.

Referring now to FIG. 2A, there is shown a block diagram of one embodiment of a system 200 for mode determination that comprises part of the system 100 for detecting at least one of an influx event and a loss event. The system 200 comprises a data source 201 of a data stream comprising drilling data, such as the data recording device 104. The data stream is sent to a mode estimation module 202 that determines whether the system 100 is in pumps circulating, pumps off transient, pumps on transient, idle, or tripping mode, as described above. The outputs of the mode estimation module 202 are connected to various alarm modules: the mode estimation module 202 sends information relevant to the determination of whether the system 100 is in "tripping" mode to an Alarms During Tripping ("AT") alarm module, which determines whether to sound an alarm. Similarly, the mode estimation module 202 sends information relevant to the determination of whether the system 100 is in "pumps off transient" mode, "pumps circulating" mode, "idle" mode, and "pumps on transient" mode, to an Alarms at Pumps Stop Transients ("AS") alarm module, to an Alarms While Drilling ("AD") alarm module, to an Alarms During Idle Times ("AI") alarm module, and to an Alarms at Pumps On Transients ("AO") alarm module, respectively, and each of those modules is able to determine from the information it receives from the mode estimation module 202 whether to sound an alarm. Each of these alarm modules is communicative with a user interface module 204 that can alert the user of the system 100 to the system's 100 current drilling mode. Each of the alarm modules is also communicative with a cross-mode aggregation module 206, which may be used for cross-mode information sharing. For example, one of the alarm modules may not trigger an alarm based only on the information that it receives from the mode estimation module 202, but it may receive information sent to the other alarm modules from the mode estimation module 202 via the cross-mode aggregation module 206 and take other action in lieu of sounding its alarm (e.g., the system 200 may trigger a different, cross-mode alarm). The cross-mode aggregation module 206 is also communicative with the user interface module 204. The modules 202,204, 206 may be implemented, for example, in software as objects in an object-oriented programming language.

Pumps Circulating Mode

When the data analysis device 124 determines that the rig is in the "pumps circulating" mode, the device 124 uses one or both of pit volume and flow out, as described below, to determine whether a loss or influx event has occurred.

In this disclosure, the following terms have the following definitions:

t—time
hd(t)—hole depth
bd(t)—bit depth
$f_{in}(t)$—flow in
$f_{out}(t)$—flow out
pv(t)—pit volume
$p_{off}(t,n)$—the $n^{th}$ most recent "pumps off event" prior to time "t"
$p_{on}(t,n)$—the $n^{th}$ most recent "pumps on event" prior to time "t"
$p_{event}(t,n)$—the $n^{th}$ most recent pumps on or pumps off event prior to time "t"
$\widehat{pv}(t)$—Estimate of pit volume at time t
$\hat{f}_{out}(t)$—Estimate of flow out at time t The device 124 uses the following methods to estimate pit volume and flow out during pumps circulating, and from one or both of pit volume and flow out determines whether one or both of a loss event and an influx event are occurring.

Pit Volume

During pumps circulating, the device 124 presumes that the drill bit 112 is being propelled through the formation 106 and that the pit volume approximately linearly decreases with hole depth (i.e., the depth of the well 108), as more of the drilling fluid is used to fill an increasingly deep well 108. Conventional attempts to determine the decrease in pit volume with increasing hole depth using only a priori measurements of various drilling parameters (i.e., measurements of various drilling parameters obtained prior to drilling commencing, such as the size of the bit 112 and diameter of the drill string 110) are typically prejudiced by their failure to take into account parameters that arise during drilling (e.g., losses in pit volume due to cuttings, and incomplete hole cleaning).

Notwithstanding those parameters that arise during drilling, the relationship between pit volume and hole depth is approximately linear:

$$\widehat{pv}_d(t) \approx \alpha * hd(t) + \gamma \quad (1)$$

In Equation (1), $\alpha$ and $\gamma$ are parameters that the device 124 determines from historical measurements of hole depth and pit volume, including a fixed number of {hole depth, pit volume} measurements from the most recently drilled N meters (typically, N=100 m) using any suitable method, such as least squares. Additional long-term activities at the rig on surface, such as adding fluid to the mud tank 120, pumping a pill, turning solids control machinery on or off, and re-organizing one or more of the mud tanks 120 in embodiments comprising multiple mud tanks 120, may also affect the observed pit volume. To the extent that the effect on the pit volume is consistent over relatively long time periods, such as from approximately 10 minutes to approximately 1 hour, the device 124 may estimate them using Equations (2) and (3):

$$\widehat{pv}_t(t) = pv(t) - \widehat{pv}_d(t) \quad (2)$$

$$\widehat{pv}_t(t) \approx \beta t \quad (3)$$

where $\beta$ is a parameter that the device 124 determines using historical values of $\widehat{pv}_d(t)$ and $pv(t)$ over the most recent T seconds, where T may vary with different embodiments. For example, T is typically between 600 seconds (10 minutes) and 3,600 seconds (1 hour). The device 124 determines resulting pit volume error using Equations (4) and (5):

$$\widehat{pv}(t) = \widehat{pv}_d(t) + \widehat{pv}_t(t) \quad (4)$$

$$\widehat{pv}_e(t) = pv(t) - \widehat{pv}(t) \quad (5)$$

The device 124 implements Equation (4) to generate an estimate for pit volume that comprises a joint depth and time sensitive regression. The device 124 implements Equation (5) to mark deviations in the pit volume by tracking the magnitude of $\widehat{pv}_e(t)$. The device 124 is accordingly able to track influx and loss events by tracking the deviations in the pit volume using Equation (5) without requiring the user to specify additional drilling parameters such as loss due to cuttings, bit depth, and hole cleaning. For example, in one embodiment the device 124 acquires one sample of data per second. For each sample of data, the device 124 estimates $\alpha$ and $\beta$, and updates $pv(t)$ and $\widehat{pv}(t)$ by applying Equations (4) and (5).

In some embodiments, such as when the pit volume is not well modeled by hole depth (e.g., the user may be changing drilling fluid weights or adding/removing fluid from the system), the device 124 may apply different versions of Equations (4) and (5) that comprise the time sensitive regression but not the depth sensitive regression. In these embodiments, the device 124 determines $\beta$ so that $\widehat{pv}(t)$ directly estimates $pv(t)$ by using historical values of $pv(t)$ (as opposed to $\widehat{pv}_d(t)$ and $pv(t)$ in embodiments in which the pit volume is well modeled by hole depth) and then applies Equations (6) and (7):

$$\widehat{pv}(t) = \widehat{pv}_t(t) \quad (6)$$

$$\widehat{pv}_e(t) = pv(t) - \widehat{pv}(t) \quad (7)$$

Regardless of whether the device 124 implements Equations (4) and (5) or (6) and (7), the device 124 is able to identify influx and loss events by tracking the sign and magnitude of $\widehat{pv}_e(t)$. In some embodiments, the device 124 identifies a loss event when the absolute value of $\widehat{pv}_e(t)$ exceeds a loss event threshold and is negative, and identifies an influx event when the absolute value of $\widehat{pv}_e(t)$ exceeds an influx event threshold and is positive.

Figure 3:
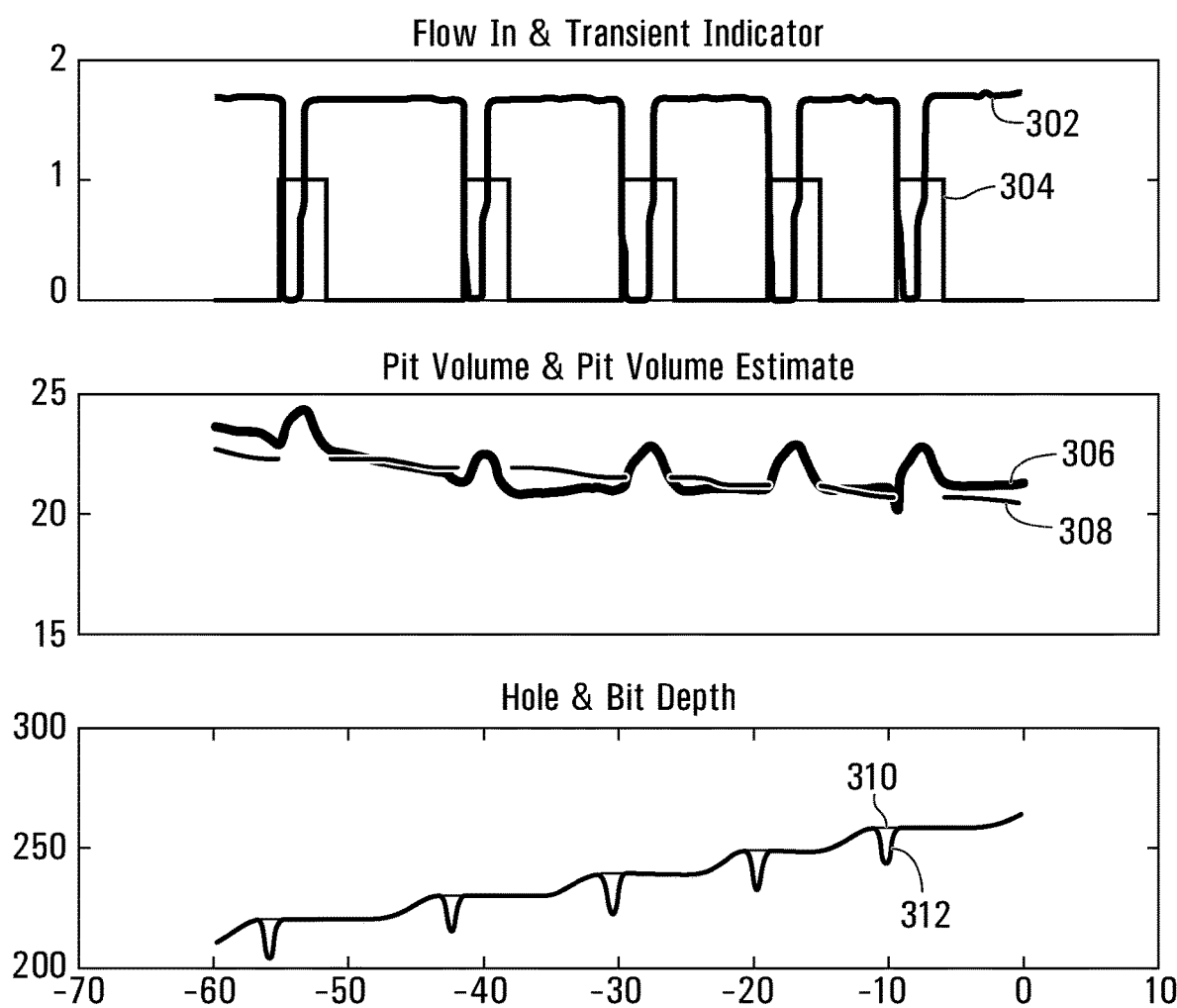
FIG. 3 shows curves showing various drilling parameters illustrating application of one embodiment of the system for detecting at least one of an influx event and a loss event during well drilling.

Referring now to FIG. 3, there are shown six curves showing various drilling parameters for the well 108 over approximately 80 minutes: a flow in curve 302 showing flow in for the well 108; a transient curve 304 showing whether the well 108 is in a transient state resulting from the pump 116 being shut off and turned back on; a pit volume curve 306 showing measured pit volume; a pit volume estimate curve 308 showing estimated pit volume as determined using Equation (4); a hole depth curve 310 showing hole depth; and a bit depth curve 312 showing bit depth. As the flow in curve 302, transient curve 304, and pit volume curve 306 show, during a transient caused by a change in the state of the pump 116 the pit volume temporarily jumps, with the jumps not resulting from a loss or influx event. In some embodiments, the device 124 accordingly disregards estimates determined using Equations (4)-(7) during transients and during other periods in which the mode estimation module 202 determines the mode not to be pumps circulating.

In some embodiments, the linear approximations relied on to determine Equations (4)-(7) are relatively poor approximations for pit volume; for example, in certain situations fluids may be added or removed from the mud tank 120 that cause the models used to determine Equations (4)-(7) to behave unexpectedly due to the time-lagged nature of the linear models. Accordingly, in some embodiments the device 124 may estimate the pit volume using a trailing minimum and a trailing maximum:

$$pv_{erode}(t) = \min(pv(t-i)) \quad (8)$$

$$pv_{dilate}(t) = \max(pv(t-i)) \quad (9)$$

where i ranges from 0 to M samples or a corresponding number of seconds, with the result being that the erode and dilate variables of Equations (8) and (9) represent trailing minimum and maximum, respectively. Using Equations (8) and (9), the device 124 determines whether changes in pit volume indicative of influx and loss events exist by determining whether $e_{influx}(t)$ of Equation (10) exceeds the influx event threshold and whether $e_{loss}(t)$ of Equation (11) exceeds the loss event threshold, respectively:

$$e_{influx}(t) = pv(t) - pv_{erode}(t) \quad (10)$$

$$e_{loss}(t) = pv_{dilate}(t) - pv(t) \quad (11)$$

Equations (8) and (9) represent special cases of order statistics (specifically, the 0% and 100% (1st and nth) order statistics of a vector of length n). Different embodiments may use different order statistics. For example, one different example embodiment may respectively use the 10% and 90% order statistics for $pv_{erode}(t)$ and $pv_{dilate}(t)$, while another different embodiment may use the 15% and 85% order statistics for $pv_{erode}(t)$ and $pv_{dilate}(t)$. Similarly, depending on the thresholds, in certain embodiments the trailing median (50% order statistic) can also be used for both the erode and dilate values. More generally, in certain embodiments any two order statistics for $pv_{erode}(t)$ and $pv_{dilate}(t)$ may be used, with the order statistic for $pv_{erode}(t)$ being less than or equal to the the trailing median, and the order statistic for $pv_{dilate}(t)$ being greater than or equal to the trailing median.

Flow Out

In addition to determining pit volume and pit volume error estimates, the device 124 also predicts expected flow out during normal drilling operations (e.g., any time the pumps are on and the system is not in a transient state) using flow in as the independent variable. During normal drilling operations, the relationship between flow in and flow out is relatively static; that is, a fixed flow in provides a relatively fixed flow out. Consequently, it is relatively difficult to determine the relationship between flow in and flow out that manifests during flow in transients (e.g., the time immediately following the pump 116 shutting off) from static drilling data. Instead, the information about the relationship between flow in and flow out is primarily contained in the time regions around the pump transients; i.e., the time periods immediately after the pump 116 transitions from on to off or vice versa. The device 124 uses the information contained in these transient regions to determine flow out based on Equation (12):

$$\hat{f}_{out}(t) = \sum_i \beta_i f_{in}(t-i) \quad (12)$$

where i varies over a fixed range, e.g. i∈[0,120s]. Since the relatively important parts of the drilling data are around (e.g., within five or ten minutes of) pump on and pump off transients, $\hat{f}_{out}(t)$ is determined using the N most recent $p_{event}(t,n)$, n∈1 . . . N, where N may be varied to control the speed with which $\beta_i$ updates. In one example embodiment, N∈[1,10] have been found to be useful for influx event detection, although in different embodiments different N values, and in particular larger N values, may be used.

Figure 4:
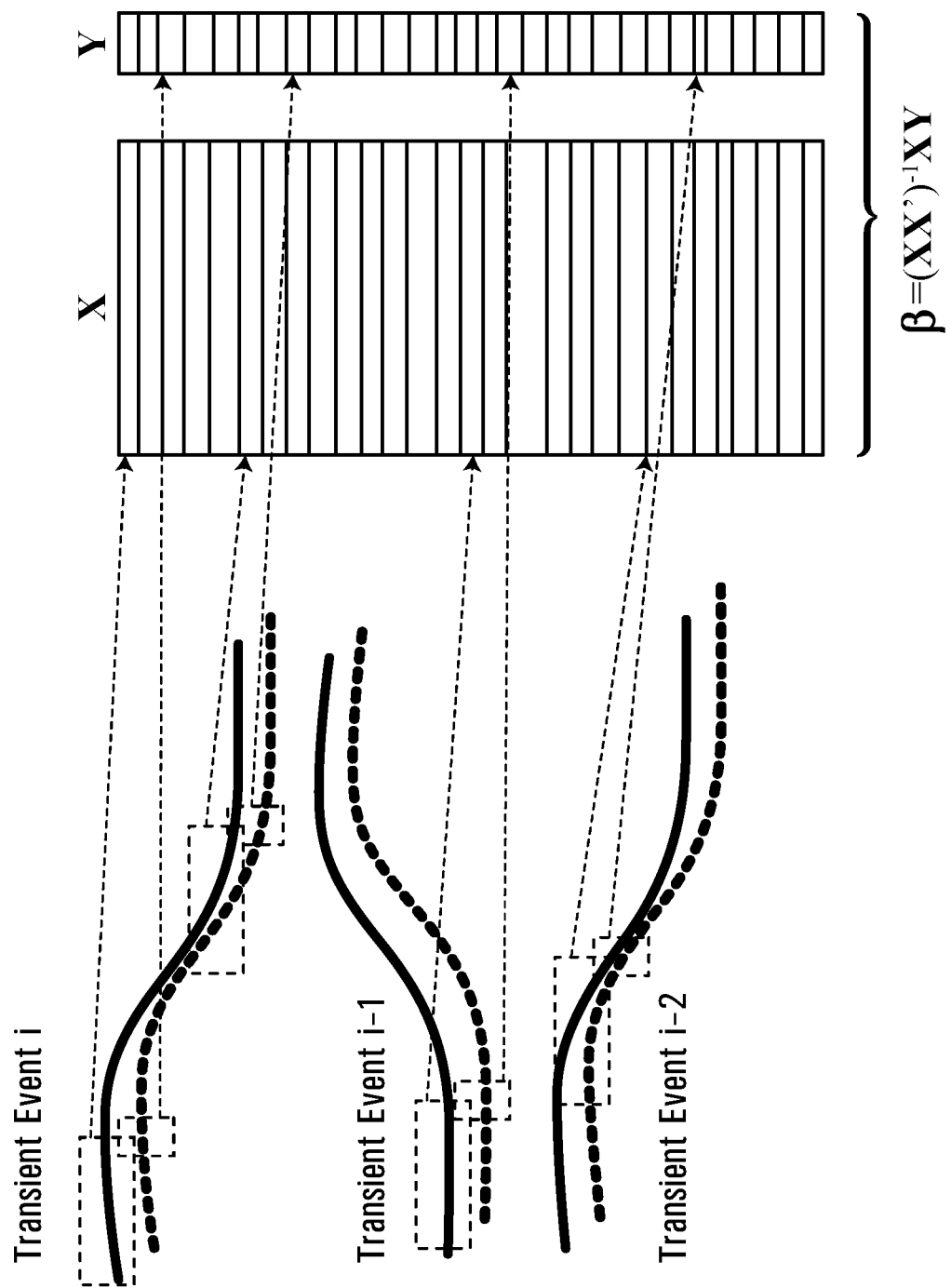

Referring now to FIG. 4, the device 124 concatenates multiple vectors of flow out and flow in data around each pump event $p_{event}(t,n)$ into a matrix and applies a least squares linear regression to determine the underlying relationship between flow out and flow in, β. In FIG. 4, X represents flow in and Y represents the regression target, flow out. The device 124 extracts data from the N most recent pump transient events $p_{event}(t,n)$ and using this data determines β as $(XX')^{-1}XY$. In certain embodiments, the model of FIG. 4 may be modified to determine $\beta_0$, which acts as a DC offset in Equation (12); this offset accounts for non-zero flow out measurements with zero-valued flow in measurements (e.g., measurements resulting from a stuck or an erroneously calibrated paddle). While in the depicted embodiment a least squares linear regression is used, in different embodiments (not depicted) one or both of a non-negative least squares regression and a robust least-squares regression may be used. Furthermore, in different embodiments, the device 124 may use an adaptive regression in which it updates $\beta_i$ using information not only during or around pump transient events, but during or around additional events as well. For example, in one example embodiment, the device 124 may continuously update $\beta_i$ with the same frequency with which it applies Equation (12) to determine $\hat{f}_{out}(t)$.

After the device 124 determines $\hat{f}_{out}(t)$, the device 124 determines the difference between $\hat{f}_{out}(t)$ and the observed $f_{out}(t)$ and is able to identify influx and loss events by tracking the sign and magnitude of this difference. In some embodiments, the device 124 identifies a loss event when the absolute value of this difference exceeds a loss event threshold and this difference is negative, and identifies an influx event when the absolute value of this difference exceeds an influx event threshold and this difference is positive.

Combining Pit Volume and Flow Out

In some embodiments, the device 124 uses only one of pit volume error and flow out error to determine whether an influx or loss event is occurring; however, in other embodiments, the device 124 uses both pit volume and flow out error to make this determination. Using both pit volume error and flow out error may help to reduce false alarms due to spurious noise without sacrificing sensitivity (i.e., while maintaining relatively high probability detection of both influx and loss events). For example, determining that an influx event is happening based on flow out error in addition to pit volume error slightly delayed in time may help to decrease the false alarm rate by reducing the likelihood that bad data (e.g., resulting from a stuck paddle) is triggering the determination that an influx or loss event is occurring. "Slightly delayed in time" refers to the length of time for the drilling fluid to travel from the return flow meter 114b to the mud tank 120; example lengths are anywhere from approximately 30 seconds to approximately 3 minutes.

Figure 5:
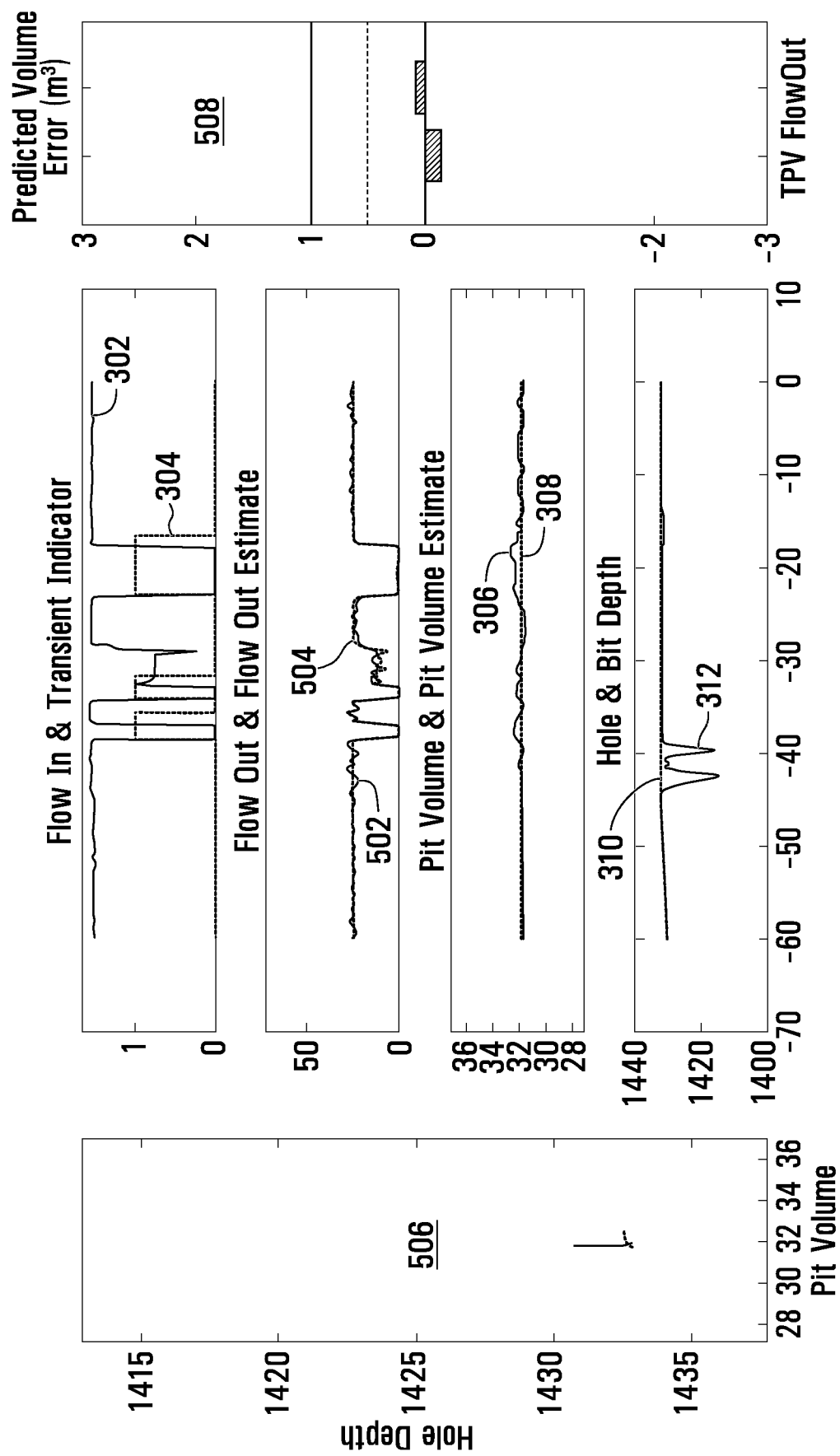
FIGS. 5 and 6 show curves of drilling parameters during normal drilling operation (FIG. 5) and when an influx event is detected (FIG. 6) by one embodiment of the system for detecting at least one of an influx event and a loss event.
Figure 6:
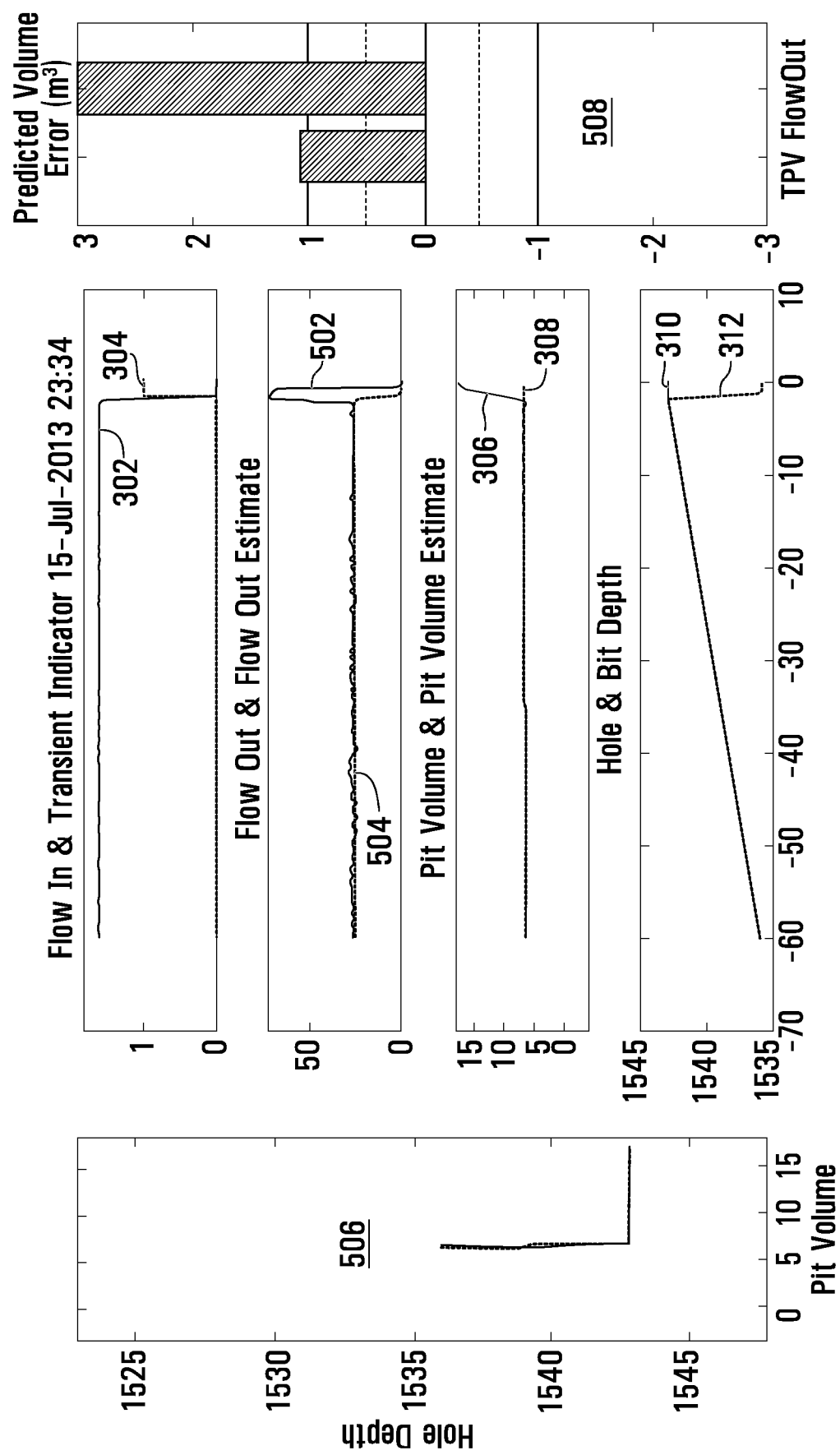

Referring now to FIGS. 5 and 6, there are shown curves showing drilling parameters during normal drilling operation (FIG. 5) and when an influx event is detected (FIG. 6). As in FIG. 3, each of FIGS. 5 and 6 comprises the flow in curve 302, transient curve 304, pit volume curve 306, pit volume estimate curve 308, hole depth curve 310, and bit depth curve 312. FIGS. 5 and 6 additionally comprise a flow out curve 502 and flow out estimate curve 504, with the flow out curve 502 representing the reading from the return flow meter 114b and the flow out estimate curve 504 being determined by the device 124 by applying Equation (12). Each of FIGS. 5 and 6 also comprises a graph 506 of hole depth vs. pit volume and a graph 508 of pit volume error vs. measured flow out.

In FIG. 5, pit volume error is relatively low, as evidenced by the graph 508 of predicted pit volume error vs. measured flow out and by comparing the pit volume and pit volume estimate curves 306,308. Additionally, flow out error is relatively low, as evidenced by the comparing the flow out and flow out estimate curves 502,504. This holds true during pump transients and during pumps circulating.

In contrast, at approximately time=0 minutes in FIG. 6, pit volume error is relatively high, as evidenced by the graph 508 of predicted pit volume error vs. measured flow out and by comparing the pit volume and pit volume estimate curves 306,308. Additionally, flow out error is relatively high, as evidenced by the comparing the flow out and flow out estimate curves 502,504. As pit volume error is positive, these errors indicate an influx event.

Pumps on Transient and Pumps Off Transient Modes

As discussed above, in some of the above embodiments the device 124 disregards pit volume estimates resulting from pump transients. In the embodiments described in this section, the device 124 estimates, during pump transient events, the relationship between flow in, flow out, and pit volume, so that during subsequent pump transient events the expected flow out and pit volume may be reconstructed from flow in data alone. This is referred to as well fingerprinting and in certain situations may enable improved influx and loss event detection when conventional fingerprinting approaches may fail (e.g., due to changing pump transient lengths or changing pump behaviors). The well fingerprinting embodiments of this section use the flow out model described in association with Equation (12), above; however, unlike the embodiments used to estimate pit volume described in association with Equations (4)-(11), these well fingerprinting embodiments do not rely on either a time or hole depth sensitive regression.

Figure 7:
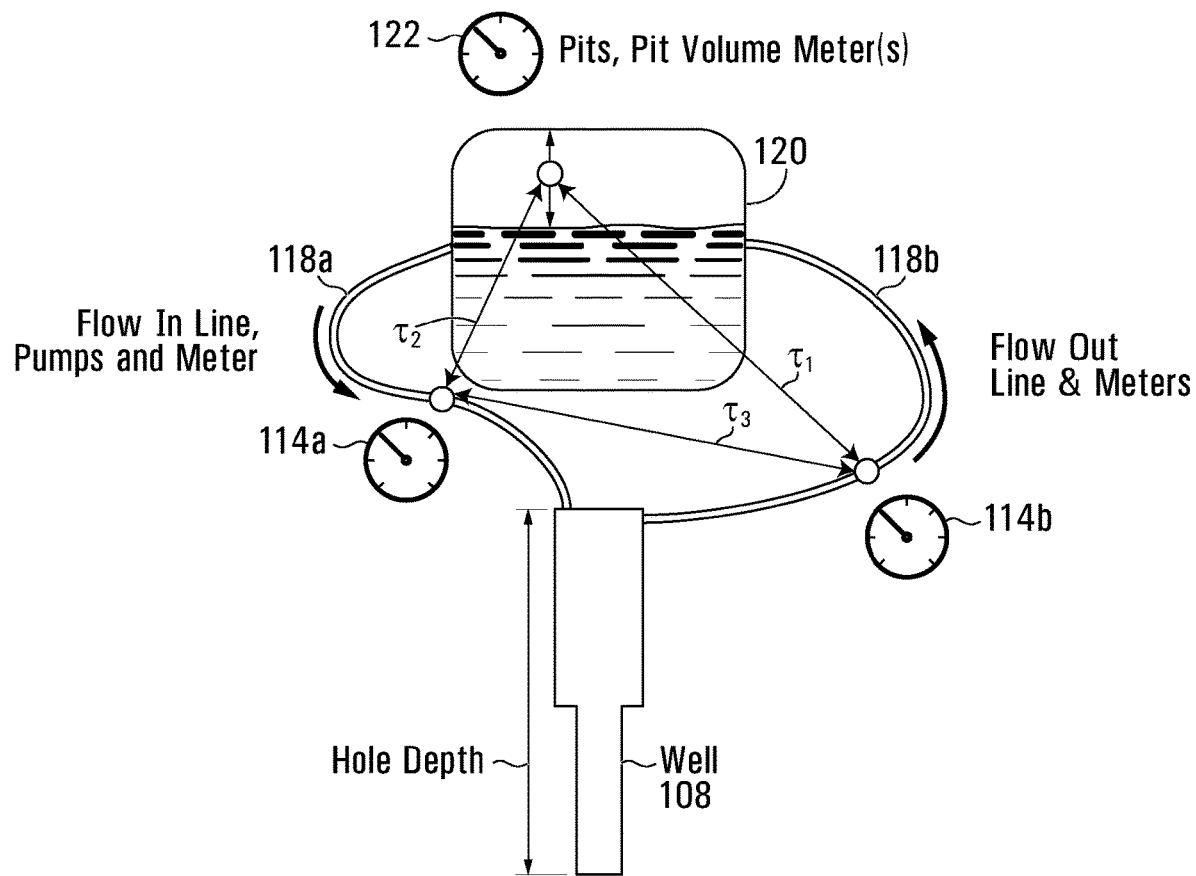
FIG. 7 shows a schematic of a closed fluid circuit comprising part of one embodiment of the system for detecting at least one of an influx event and a loss event.

Instead, the well fingerprinting embodiments primarily use transient data. Referring now to FIG. 7, there is shown a schematic of the closed fluid circuit comprising the mud tank 120, fluid input line 118a, fluid return line 118b, well 108, volume meter 122, and flow meters 114a,b. FIG. 7 also shows time delays $\tau_1$, $\tau_2$, and $\tau_3$, which represent the time delays before a change in flow measured by the return flow meter 114b results in a change in volume measured by the volume meter 122, before a change in volume measured by the volume meter 122 results in a change in flow measured by the input flow meter 114a, and before a change in flow recorded by the input flow meter 114a results in a change of flow measured by the return flow meter 114b, respectively. In one different embodiment, instead of the input flow meter 114a the device 124 is communicatively coupled to the mud pump 116 and tracks the mud pump's 116 strokes, and measures the volume of mud pumped over a period of time by multiplying the number of pump strokes during that period by the displacement per pump stroke. In this different embodiment, $\tau_2$ represents the delay between the pump stroke and when the resultant volume change manifests in the mud pit 120.

As volume that the volume meter 122 measures is the integral of flow, and taking into account time delays $\tau_1$ and $\tau_2$, results in Equation (13):

$$pv(t) = \int f_{out}(t-\tau_1)dt - \int f_{in}(t-\tau_2))dt + fn(t) + C \quad (13)$$

where n(t) represents variations due to factors such as changing hole depth and manually adding or removing drilling fluid from the mud tank 120, and C is a constant offset representing initial volume of the mud tank 120. Equation (13) holds if units used for the pit volume, flow in, and flow out are all compatible and the meters 114a,b,122 are all calibrated. Practically, however, flow in may be measured in m³/minute but measurement accuracy may be prejudiced by hidden assumptions about pump efficiency and fluid compositions. The situation for flow out may be worse, with direct measurement of flow out rarely occurring as flow out paddles typically are highly variable and measure flow in terms of percent as opposed to volume; instead, flow out is typically measured in angular displacement of a flow paddle. Therefore, to a first order approximation:

$$pv(t) = \gamma(\int \dot{f}_o(t-\tau_1)dt - \alpha \int \dot{f}_i(t-\tau_2)dt + fn(t) \quad (14)$$

where $\dot{f}_o$ represents normalized flow measurements so a percentage measurement from a flow paddle is expressed in volume per unit time such as m³/min, $\dot{f}_i$ is typically left in its original units ($\dot{f}_i = f_i$), and some linear or non-linear relationship between $f_o$ and $f_i$ is used to determine the flow out in approximate units of m³ per unit-time (e.g., $\dot{f}_o = \delta_1 f_o + \delta_0$).

Depending on the well 108, the parameters $\delta_1$, $\delta_0$, $\tau_1$, $\tau_2$, $\alpha$, and $\gamma$ may be different and the device 124 accordingly determines on a per well basis what these parameters are from historical flow out, flow in, and pit volume data, with recalibration being done periodically (e.g., at pump on and off events, or once a day). The device 124 determines $\delta_1$ and $\delta_0$ using flow out and flow in data measured during pump transient events, as described above in respect of the pumps circulating mode. Equation (14) can then be recast as:

$$pv(t) \approx (\int \dot{f}_o(t-\tau_1)dt - \alpha \int \dot{f}_i(t-\tau_2)dt)\beta \quad (15)$$

Taking the derivative of each side results in Equation (16):

$$\frac{dpv}{dt}(t) \approx (\dot{f}_o(t-\tau_1) - \alpha \dot{f}_i(t-\tau_2))\beta \quad (16)$$

Under normal drilling operations, absent gains or losses and ignoring secondary effects, the flow-out is well represented by a scaled version of the time-delayed flow-in, which permits the computationally efficient approximation of Equation (16.1):

$$\frac{dpv}{dt}(t) \approx \Sigma \gamma_j \frac{df_i(t-j)}{dt} \quad (16.1)$$

Depending on the particular well 108 (e.g., whether it is more numerically acceptable to integrate flow or differentiate pit volume), the device 124 may apply any one or more of Equations (15), (16), and (16.1) to determine $\tau_1$, $\tau_2$, $\alpha$, and $\beta$ using any suitable technique. To simplify this determination, the device 124 may constrain $\tau_1$ and $\tau_2$ to be on the order of the maximum feasible delay between 1) the return flow meter 114b and the mud tank 120 and 2) the mud tank 120 and the input flow meter 114a, respectively; example constraints for each of $\tau_1$ and $\tau_2$ range from approximately 10 seconds to approximately 5 minutes. Similarly, the device 124 may constrain $\alpha$ and $\beta$ to be near one, such as between approximately 0.8 and approximately 1.5, assuming the flow in units agree with the pit volume units and $\delta_1$ and $\delta_0$ are estimated correctly. The device 124 may, for example, determine $\tau_1$, $\tau_2$, $\alpha$, and $\beta$ by performing an exhaustive search over reasonable parameter ranges, such as the ones provided above.

Figure 8A:
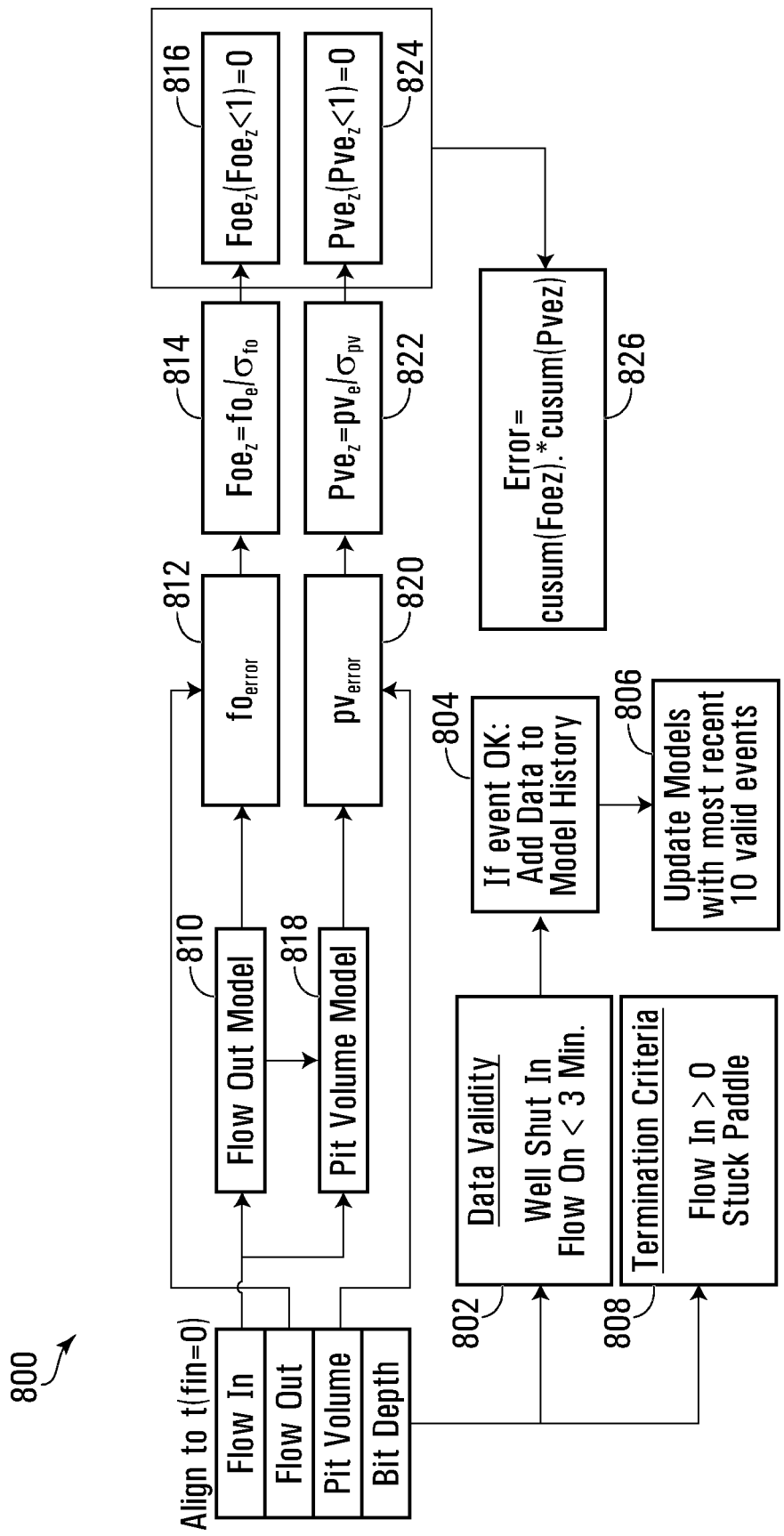
FIGS. 8A and 8B show flowcharts of example methods for detecting at least one of an influx event and a loss event during well drilling, according to additional embodiments.

Referring now to FIG. 8A, there is shown an example method 800 for detecting at least one of an influx event and a loss event during drilling, according to another embodiment. The method 800 is expressed as computer program code and is stored within a memory comprising part of the device 124 for execution by a processor comprising part of the device 124. While the method 800 of FIG. 8A is directed at influx event detection at a pumps off transient event, in different embodiments (not depicted) the method 800 may instead be directed at loss event detection at a pumps off transient event or at loss or influx event detection at either a pumps on or pumps off transient event.

As shown in FIG. 8A, the method 800 uses four parameters: flow in, flow out, pit volume, and bit depth; data streams for each of these parameters are aligned at the time corresponding to flow in equaling zero (i.e., the beginning of the pumps off transient event). The device 124 proceeds to block 802 where it assesses data validity for use in future applications of the method 800. In the depicted embodiment the device 124 assesses validity by determining factors such as whether the well 108 is shut in, whether flow has been on for less than a predetermined threshold such as three minutes, whether the sensors have output anomalous data (e.g., negative flow readings, unrealistically high flow readings such as 1,000 m³/min, constant flow readings for unrealistically long durations that are indicative of a stuck flow paddle), and whether any expected data is missing. If the device 124 determines the data is valid, the method 800 proceeds to block 804 where the data is added to a model history for future use and then to block 806 where the device 124 proceeds to blocks 810 and 818, as described below, to apply the flow out and pit volume models as described by Equations (12), (15), and (16). In the depicted example embodiment, if the device 124 determines that the data is not valid, it does not store the data for use in future applications of the method 800, but still performs the method 800 starting at blocks 810 and 818 as described below. In different embodiments (not depicted), if the device 124 determines that the data is not valid, it may terminate the method 800 and not perform blocks 810 or 818.

The device 124 also determines whether to terminate the method at block 808 by applying one or more termination criteria. In this example embodiment, the termination criteria comprise whether flow in is greater than zero, and whether the paddle is stuck. In different embodiments the termination criteria may be different any may additionally or alternatively comprise whether the drill bit 112 is in motion. If one or more of these termination criteria are satisfied, the device 124 ends the method 800. In the depicted example embodiment, the device 124 performs block 808 after every data sample and block 802 at the end of a pumps off event; however, in different embodiments (not depicted), the device 124 may perform both blocks 802 and 808 at every data sample, at the end of a pumps off event, or at a different rate.

The device 124 performs the branches of the flow chart beginning at blocks 810 and 818 in parallel; the device 124 determines flow out error with the branch beginning at block 810 and determines pit volume error with the branch beginning at block 818. At block 810, the device 124 determines the flow out estimate by applying Equation (12). The device 124 then proceeds to block 812 and determines flow out error by determining $f_{out}(t) - \hat{f}_{out}(t)$ and then at block 814 applies Equation (17):

$$f_{out}error = \frac{f_{out}(t) - \hat{f}_{out}(t)}{\sigma_{out}(t)} \quad (17)$$

Prior to applying Equation (17), the device 124 updates $\sigma_{out}(t)$ by determining the standard deviation of $f_{out}(t) - \hat{f}_{out}(t)$ over the last N pumps on or pumps off transients.

At block 818, the device 124 estimates pit volume from expected flow out by applying Equation (18):

$$\widehat{pv}(t) = (\int \hat{f}^{Est}_o(t-\tau_1)dt - \alpha \int \hat{f}_i(t-\tau_2)dt)\beta \quad (18)$$

where $\hat{f}^{Est}$ represents the expected flow out, corrected with $\delta_1$ and $\delta_2$. In a different embodiment, the device 124 may alternatively directly apply Equation (16.1).

At block 820, the device 124 determines the pit volume error by determining $pv(t) - \widehat{pv}(t)$ and then at block 822 applies Equation (19):

$$pv_{error} = (pv(t) - \widehat{pv}(t))/\sigma_{pv}(t) \quad (19)$$

Prior to applying Equation (19), the device 124 updates $\sigma_{pv}(t)$ by determining the standard deviation of $pv(t) - \widehat{pv}(t)$ over the last N pumps on or pumps off transients.

After determining $f_{out}error$ and $pv_{error}$, the device 124 at blocks 816, 824, and 826 determine that a loss event has occurred if both $f_{out}error$ and $pv_{error}$ exceed their loss event thresholds and each is negative, and that an influx event has occurred they both exceed their influx event thresholds and each is positive. At blocks 816 and 824, the device 124 removes relatively small values of $f_{out}error$ and $pv_{error}$ (e.g., values having a magnitude <1) from consideration, and proceeds to block 826 where it determines an error metric as the product of the cumulative sum of $f_{out}error$ and the cumulative sum of $pv_{error}$. By removing relatively small values at blocks 816 and 824, the device 124 avoids the situation where very large errors in one of flow out and pit volume are multiplied at block 826 with very small errors in the other of flow out and pit volume to skew the determination of whether a loss or influx event is occurring.

While FIG. 8A and Equations (17) and (19) in particular refer to $\sigma_{out}(t)$ and $\sigma_{pv}(t)$, in different embodiments (not depicted) the device 124 may apply FIG. 8A and omit these variables, in effect setting them to always equal 1. The device 124 can therefore instead use raw sensor values not divided by one or both of $\sigma_{out}(t)$ and $\sigma_{pv}(t)$.

Other embodiments in addition or as an alternative to those described above that shown in FIG. 8A are possible. For example, in one different embodiment blocks 816 and 824 are omitted, and the outputs of block 814 and 822 (regardless of whether they are divided by $\sigma_{out}(t)$ and $\sigma_{pv}(t)$) are used directly in block 826. In some different embodiments, a function other than cumulative sum is used at block 826.

Figure 8B:
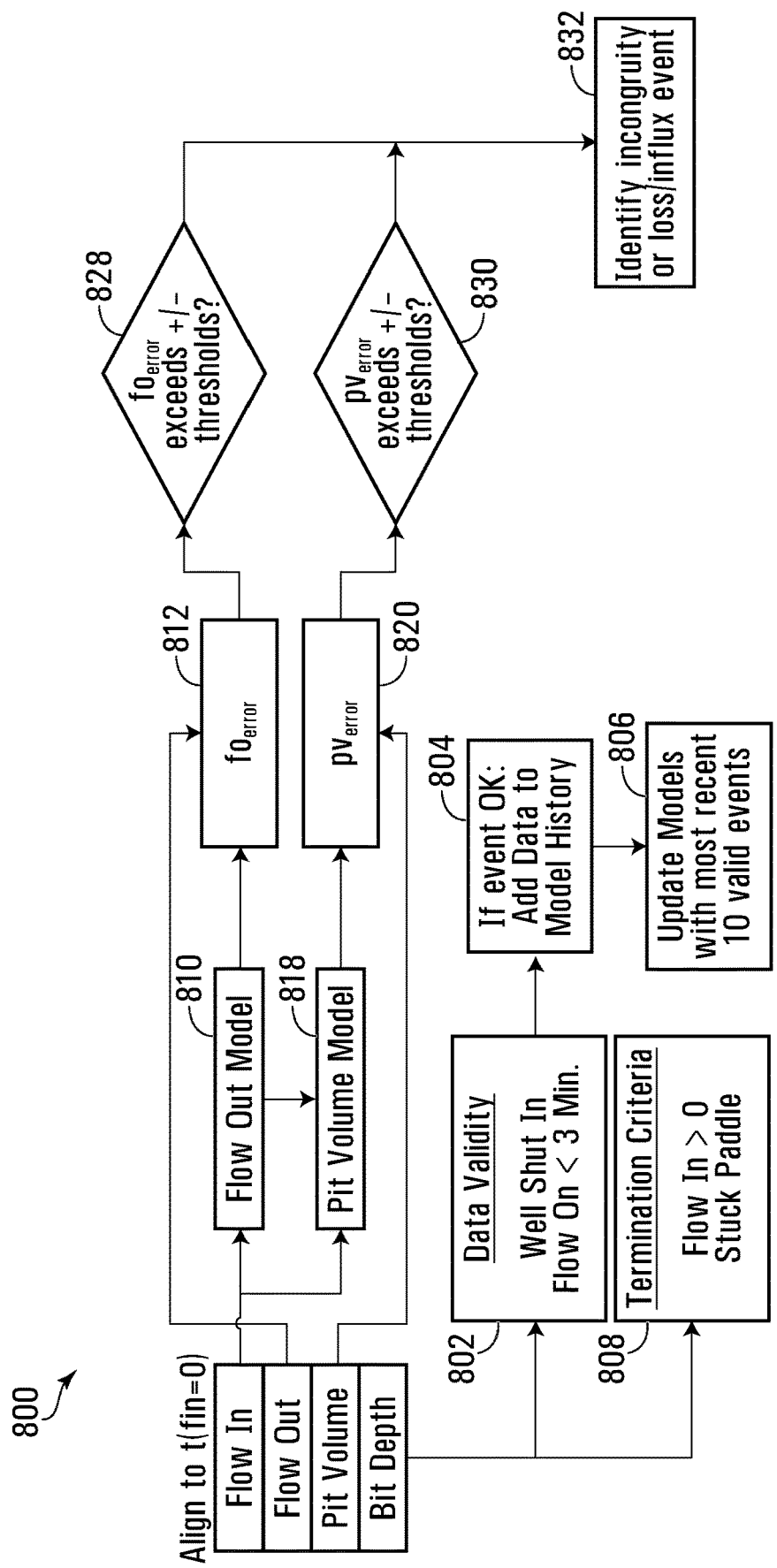

FIG. 8B depicts a flowchart for one alternative embodiment of the method 800. In this embodiment, blocks 814, 816, 822, 824, and 826 are omitted. At block 812, $f_{out}error$ is determined as $\int_{\tau=0}^{t} f_{out}error(\tau)d\tau$, and at block 820 $pv_{error}$ is determined as one of $pv_{error_i} = \max_{t=0 \ldots \tau} pv_{error}(\tau)$ for influxes, or $$pv_{error_i} = \min_{t=0 \ldots \tau} pv_{error}(\tau)$$

for losses. From block 812, the device 124 proceeds to new block 828 where it determines whether $\int_{\tau=0}^{t} f_{out}error \, d\tau$ exceeds its influx event threshold and is positive or exceeds its loss event threshold and is negative; similarly, from block 820 the device 124 proceeds to new block 830 where it determines whether $pv_{error_i}$ has a magnitude that exceeds its influx event threshold and is positive (for influxes) or $pv_{error_i}$ has a magnitude that exceeds its loss event threshold and is negative (for losses). The device 124 then proceeds to new block 832 where, if both $\int_{\tau=0}^{t} f_{out}error \, d\tau$ and $pv_{error_i}$ are positive and have magnitudes that exceed their influx event thresholds the device 124 identifies an influx event; if both $\int_{\tau=0}^{t} f_{out}error \, d\tau$ and $pv_{error_i}$ are negative and have magnitudes that exceed their loss event thresholds the device 124 identifies a loss event; and where if $\int_{\tau=0}^{t} f_{out}error \, d\tau$ exceeds its influx threshold, and $pv_{error_i}$ exceeds its loss threshold or $\int_{\tau=0}^{t} f_{out}error \, d\tau$ exceeds its loss threshold and $pv_{error_i}$ exceeds its influx threshold, the device alerts the user to a potential problem indicated by this incongruity.

Figure 9:
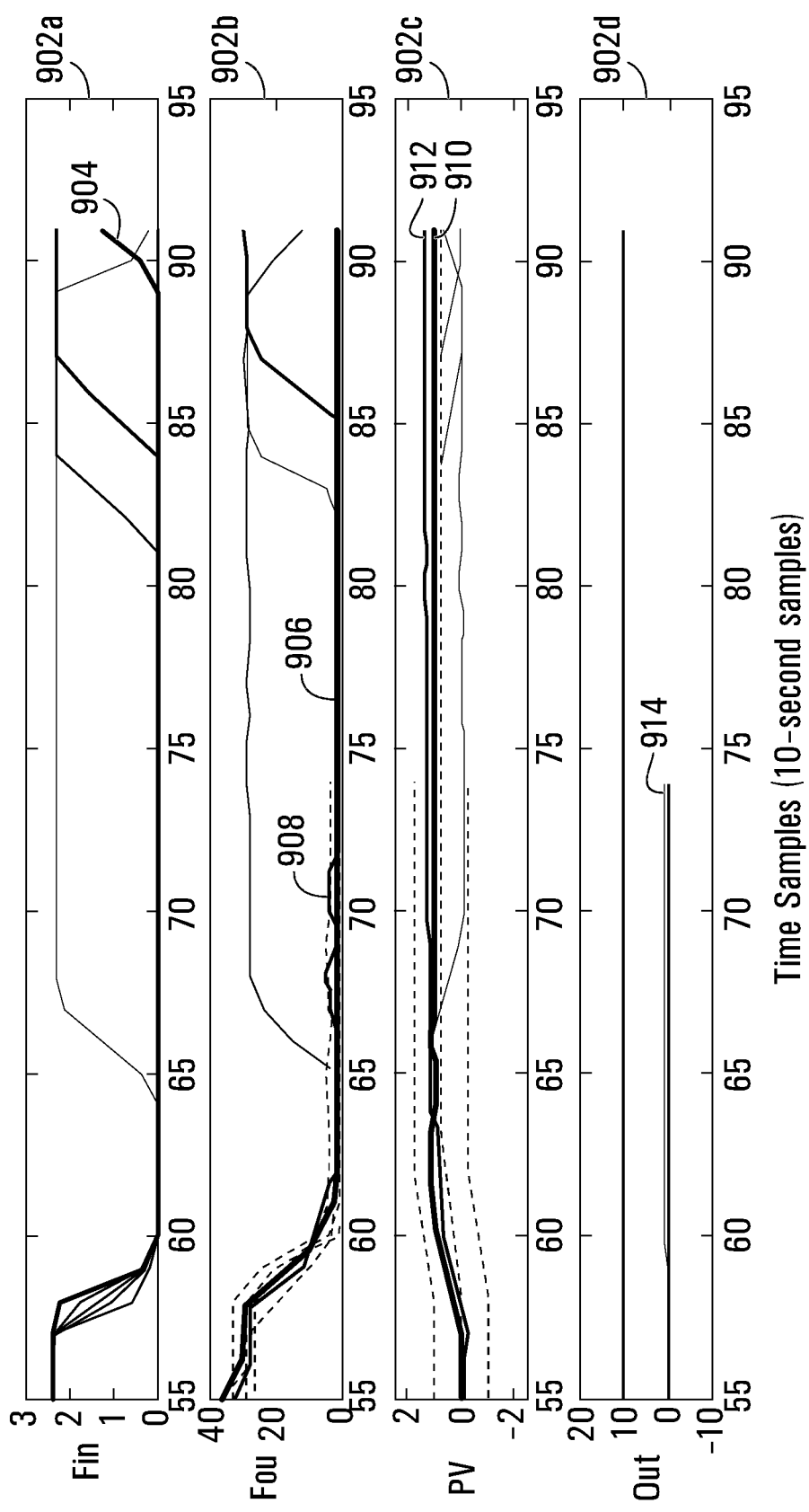
FIG. 9 shows curves of drilling parameters during normal drilling operation as determined by one embodiment of the system for detecting at least one of an influx event and a loss event.

Referring now to FIG. 9 there are shown four graphs 902a-d: a measured flow in graph 902a showing measured flow in using a measured flow in curve 904; a flow out graph 902b showing measured and predicted flow out using a measured flow out curve 906 and a predicted flow out curve 908; a pit volume graph 902c showing measured and predicted pit volume using a measured pit volume curve 910 and a predicted pit volume curve 912; and an output metric graph 902d with an output curve 914 that substantially deviates from zero if the device 124 determines that a loss or influx event has occurred. As FIG. 9 shows normal drilling, the output curve 914 is substantially equal to zero.

Modifications to Flow Out Embodiment

The embodiment for estimating flow out based on flow in and described in association with Equation (12), above, may experience artefacts attributable to axial motion of the drill string 110 while hole depth stays constant (e.g., washing, reaming, pumps circulating). The error in that flow out model is referred to as fresidual(t)=fout(t)−$\hat{f}_{out}^{fin}(t)$ where the superscript $f_{in}$ of $\hat{f}_{out}^{fin}(t)$ indicates that fout(t) is determined using only the flow in measurements. As a predictor of this residual flow, the device 124 may apply Equation (20):

$$bd_\delta(t) = \frac{d}{dt}(hd(t) - bd(t)) \quad (20)$$

where $bd_\delta(t)$ measures relative motion of the drill string 110 (bit depth) compared to the hole depth. At any particular time, the residual flow out error may be determined using the recent history of $bd_\delta(t)$, such as by using Equation (21):

$$\text{fresidual}(t) = \hat{f}^{bd} = \Sigma a_i bd_\delta(t-i) \quad (21)$$

and thus the device may estimate total flow out using Equation (22):

$$\hat{f}\text{out}(t) = \hat{f}^{fin}(t) + \hat{f}^{bd}(t) \quad (22)$$

The data for the device 124 to apply Equations (21) and (22) may be extracted from a certain number of minutes' worth of data (e.g., ten minutes) preceding the N most recent pumps off events where:
(a) the previous flow-out estimate was less than or equal to a maximum error threshold, such as at no point during that certain number of minutes was the error greater than a predetermined threshold such as approximately 5% or approximately 10%;
(b) there is sufficient axial motion of the drill string 110, such as the drill string 110 moved more than a predetermined threshold (e.g., 1 m) off bottom and returned to within that predetermined threshold off bottom during that certain number of minutes;
(c) there is no evidence of bad data, such as sudden jumps in flow in, flow out, or drill string 110 motion; and
(d) N can be adjusted, with larger values of N resulting in more accurate determinations, and lower values of N resulting in faster adaptations to new well behaviors. In certain example embodiments, N=20.

In different embodiments, the data for the device 124 to apply Equations (21) and (22) may be extracted from a certain number of minutes' worth of data (e.g., any of 1, 2, 3, 4, or 5) preceding or around the N most recent bit motion events, which are events in which the drill bit 112 moves more than 1 meter off bottom and the velocity of the drill bit 112 is greater than 10 cm/second for at least 10 seconds.

Figure 10:
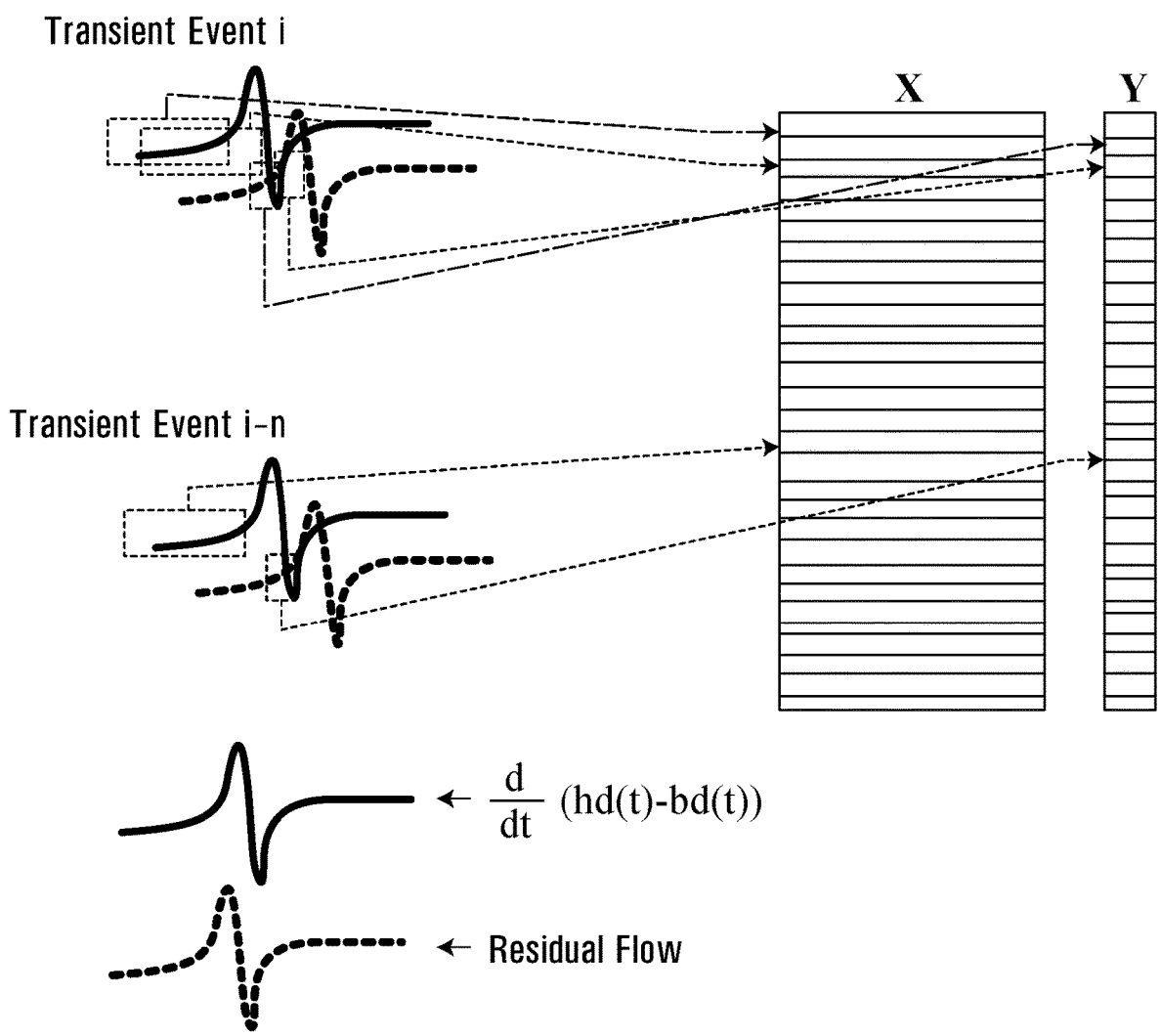
FIG. 10 illustrates one embodiment of a method performed by one embodiment the system for detecting at least one of an influx event and a loss event to determine the relationship between residual flow and change in bit depth.

FIG. 10 demonstrates the method by which the device 124 determines the data that permits it to apply Equations (21) and (22). The derivative with respect to time of the difference between hole depth and bit depth at different times during a transient event populates X, while the residual flow for that difference populates the corresponding entry in Y. $\alpha$ then equals $(XX')^{-1}XY$. While this embodiment describes a least squares regression approach, as described above different regression approaches, such as a non-negative least squares, robust least squares, support vector machines, and random forest approaches, may be used.

The device 124 may apply Equation (22) to flag influx and loss events and other phenomena such as ballooning. Additionally, the relationship between flow out and pipe motion embodied by Equation (22) may be used to flag swabbing, which refers to reducing pressure in the well 108 by moving the drill string 110, wireline tools or rubber-cupped seals up the well 108. As the drill bit 112 may move significantly during any phase of drilling, at least for a short period of time, in some embodiments the device 124 may apply Equation (22) at all times while in operation.

Figure 11:
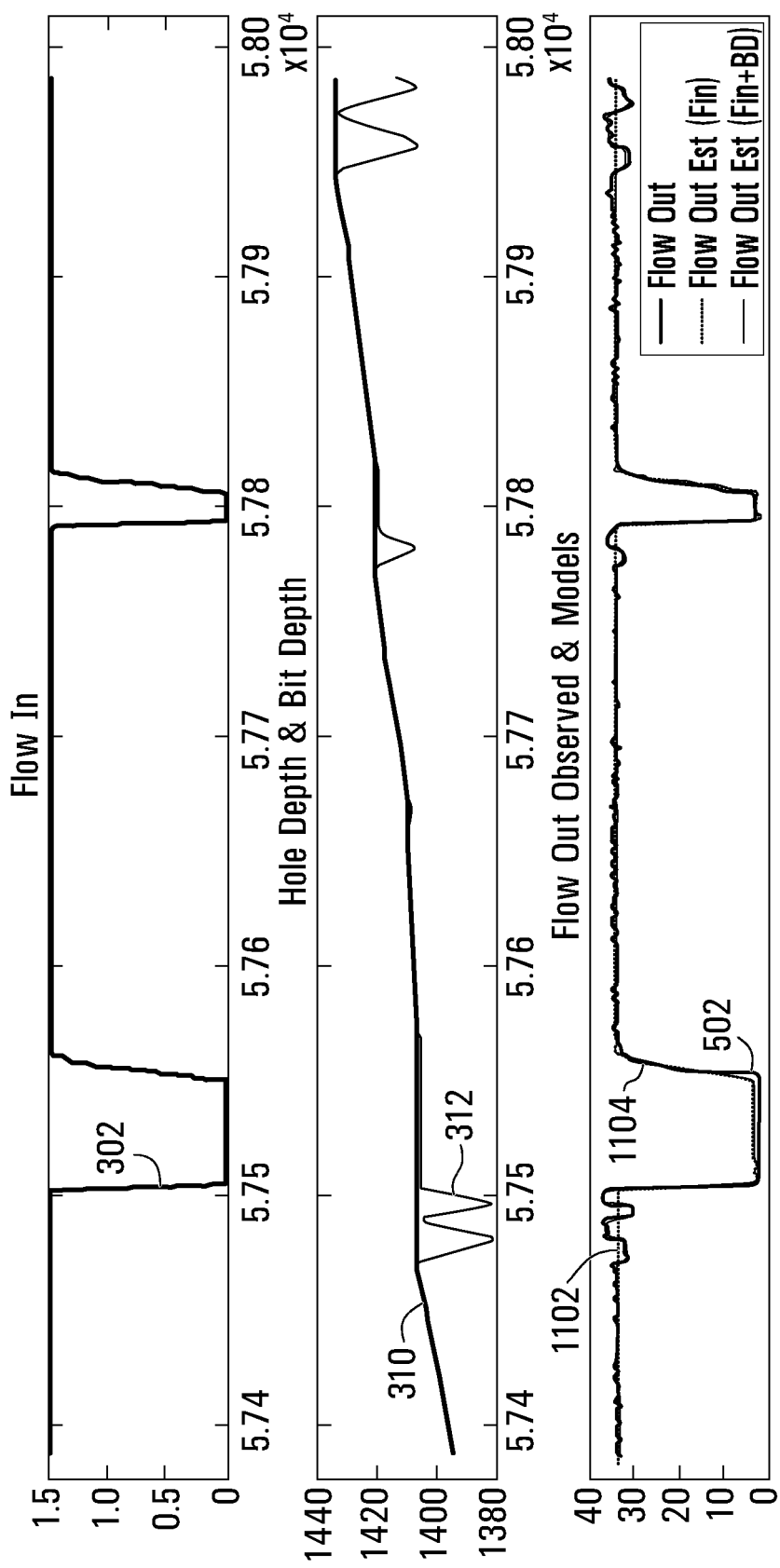
FIG. 11 shows curves of drilling parameters during normal drilling operation as determined by one embodiment of the system for detecting at least one of an influx event and a loss event.

Referring now to FIG. 11, there are shown curves showing drilling parameters during normal drilling operation. As in FIGS. 5 and 6, FIG. 11 comprises the flow in curve 302, hole depth curve 310, bit depth curve 312, flow out curve 502, a first flow out estimate curve 1102 determined using Equation (12), and a second flow out estimate curve 1104 determined using Equation (22). Periods of time of relatively fast drill string motion are circled in FIG. 11. As evident from FIG. 11, during periods of relatively rapid drill string motion, the second flow out estimate curve 1104 more closely tracks measured flow out than the first flow estimate curve, particularly immediately prior to a pumps off transient event when the drill string 110 is moved significant off the bottom of the well 108.

The embodiments have been described above with reference to flowcharts and block diagrams of methods, apparatuses, systems, and computer program products. In this regard, the flowcharts and block diagrams in the figures illustrate the architecture, functionality, and operation of possible implementations of various embodiments. For instance, each block of the flowcharts and block diagrams may represent a module, segment, or portion of code, which comprises one or more executable instructions for implementing the specified logical function(s). In some alternative embodiments, the functions noted in that block may occur out of the order noted in those figures. For example, two blocks shown in succession may, in some embodiments, be executed substantially concurrently, or the blocks may sometimes be executed in the reverse order, depending upon the functionality involved. Some specific examples of the foregoing have been noted above but those noted examples are not necessarily the only examples. Each block of the block diagrams and flowcharts, and combinations of those blocks, may be implemented by special purpose hardware-based systems that perform the specified functions or acts, or combinations of special purpose hardware and computer instructions.

Each block of the flowcharts and block diagrams and combinations thereof can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions or acts specified in the blocks of the flowcharts and block diagrams.

These computer program instructions may also be stored in a computer readable medium that can direct a computer, other programmable data processing apparatus, or other devices to function in a particular manner, such that the instructions stored in the computer readable medium produce an article of manufacture including instructions that implement the function or act specified in the blocks of the flowcharts and block diagrams. The computer program instructions may also be loaded onto a computer, other programmable data processing apparatus, or other devices to cause a series of operational steps to be performed on the computer, other programmable apparatus or other devices to produce a computer implemented process such that the instructions that execute on the computer or other programmable apparatus provide processes for implementing the functions or acts specified in the blocks of the flowcharts and block diagrams.

Figure 12:
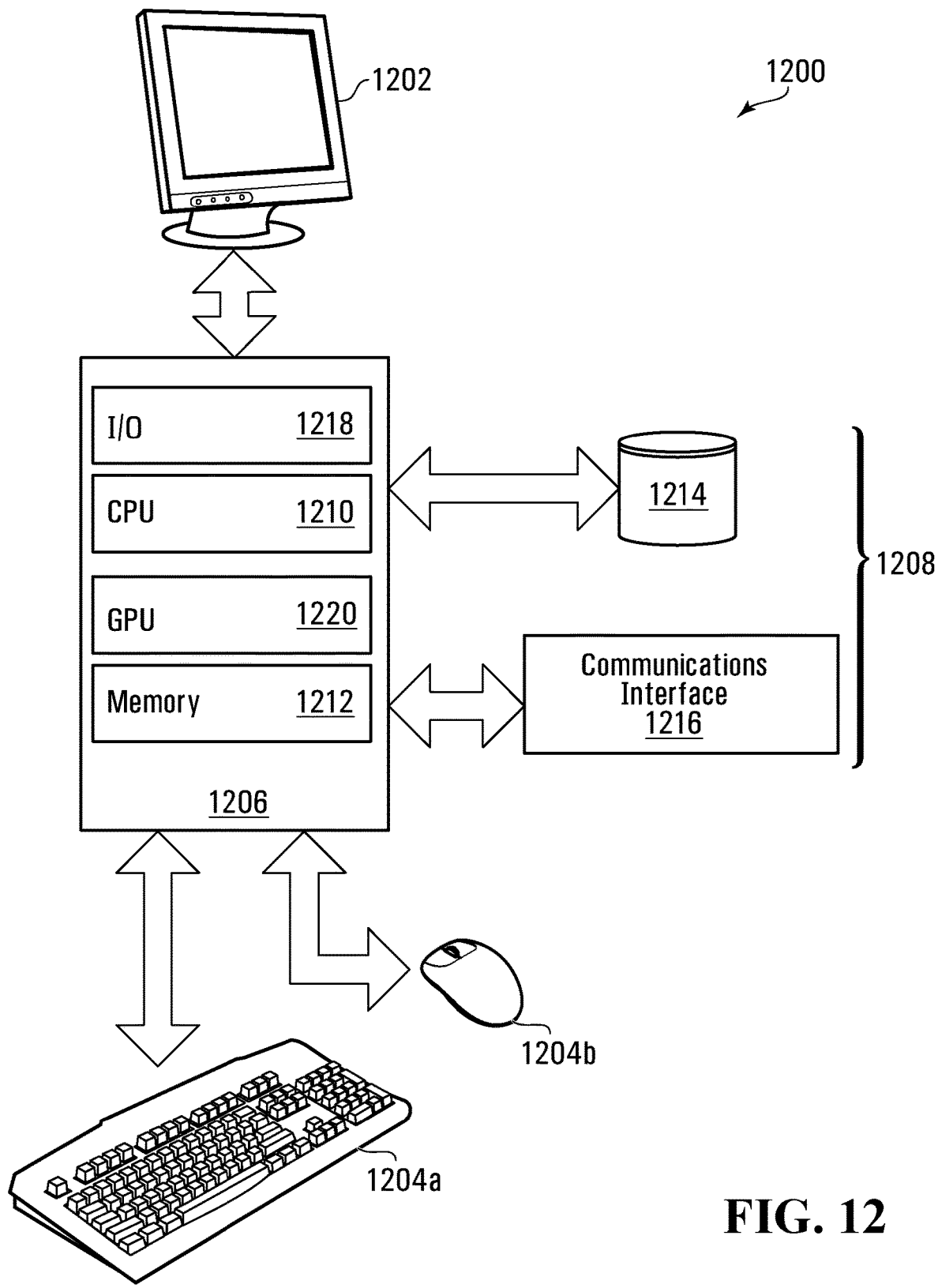
FIGS. 12 and 13 show examples of data analysis devices that may be used to detect at least one of an influx event and a loss event during well drilling, according to additional embodiments.

An illustrative computer system 1200 in respect of which the methods herein described may be implemented is presented as a block diagram in FIG. 12. The computer system 1200 may, for example, be used as the analysis device 124, recording device 104, or any combination thereof. The computer system 1200 comprises a display 1202, input devices in the form of keyboard 1204a and pointing device 1204b, computer 1206, and external devices 1208. While the pointing device 1204b is depicted as a mouse, other types of pointing devices may also be used. In alternative embodiments (not depicted), the computer system 1200 may not comprise all the components depicted in FIG. 12. For example, when used as the analysis device 124, the computer system 1200 may lack the keyboard 304a and mouse 304b. The analysis device 124 may, for example, be used only to present data to the user, or the display 1202 may be a touchscreen display that also allows the user to enter commands such as the touchscreen interface depicted in FIG. 14.

The computer 1206 may comprise one or more processors or microprocessors, such as a central processing unit ("CPU") 1210, which is depicted. The CPU 1210 performs arithmetic calculations and control functions to execute software stored in an internal memory 1212, such as one or both of random access memory ("RAM") and read only memory ("ROM"), and possibly additional memory 1214. The additional memory 1214 may comprise, for example, mass memory storage, hard disk drives, optical disk drives (including CD and DVD drives), magnetic disk drives, magnetic tape drives (including LTO, DLT, DAT and DCC), flash drives, program cartridges and cartridge interfaces such as those found in video game devices, removable memory chips such as EPROM or PROM, emerging storage media, such as holographic storage, or similar storage media as known in the art. This additional memory 1214 may be physically internal to the computer 1206, or external as shown in FIG. 12, or both.

The computer system 1200 may also comprise other similar means for allowing computer programs or other instructions to be loaded. Such means can comprise, for example, a communications interface 1216 that allows software and data to be transferred between the computer system 1200 and external systems and networks. Examples of the communications interface 1216 comprise a modem, a network interface such as an Ethernet card, a wireless communication interface, or a serial or parallel communications port. Software and data transferred via the communications interface 1216 are in the form of signals which can be electronic, acoustic, electromagnetic, optical, or other signals capable of being received by the communications interface 1216. Multiple interfaces can be provided on the computer system 1200.

Input to and output from the computer 1206 is administered by the input/output ("I/O") interface 1218. The I/O interface 1218 administers control of the display 1202, keyboard 1204a, external devices 1208 and other analogous components of the computer system 1200. The computer 1206 also comprises a graphical processing unit ("GPU") 1220. The GPU 1220 may also be used for computational purposes as an adjunct to, or instead of, the CPU 1210, for mathematical calculations. However, as mentioned above, in alternative embodiments (not depicted) the computer system 1200 need not comprise all of these elements. For example, the analysis device 124 may lack the keyboard 1204a, mouse 1204b, and GPU 1220.

The various components of the computer system 1200 are coupled to one another either directly or indirectly by shared coupling to one or more suitable buses.

Figure 13:
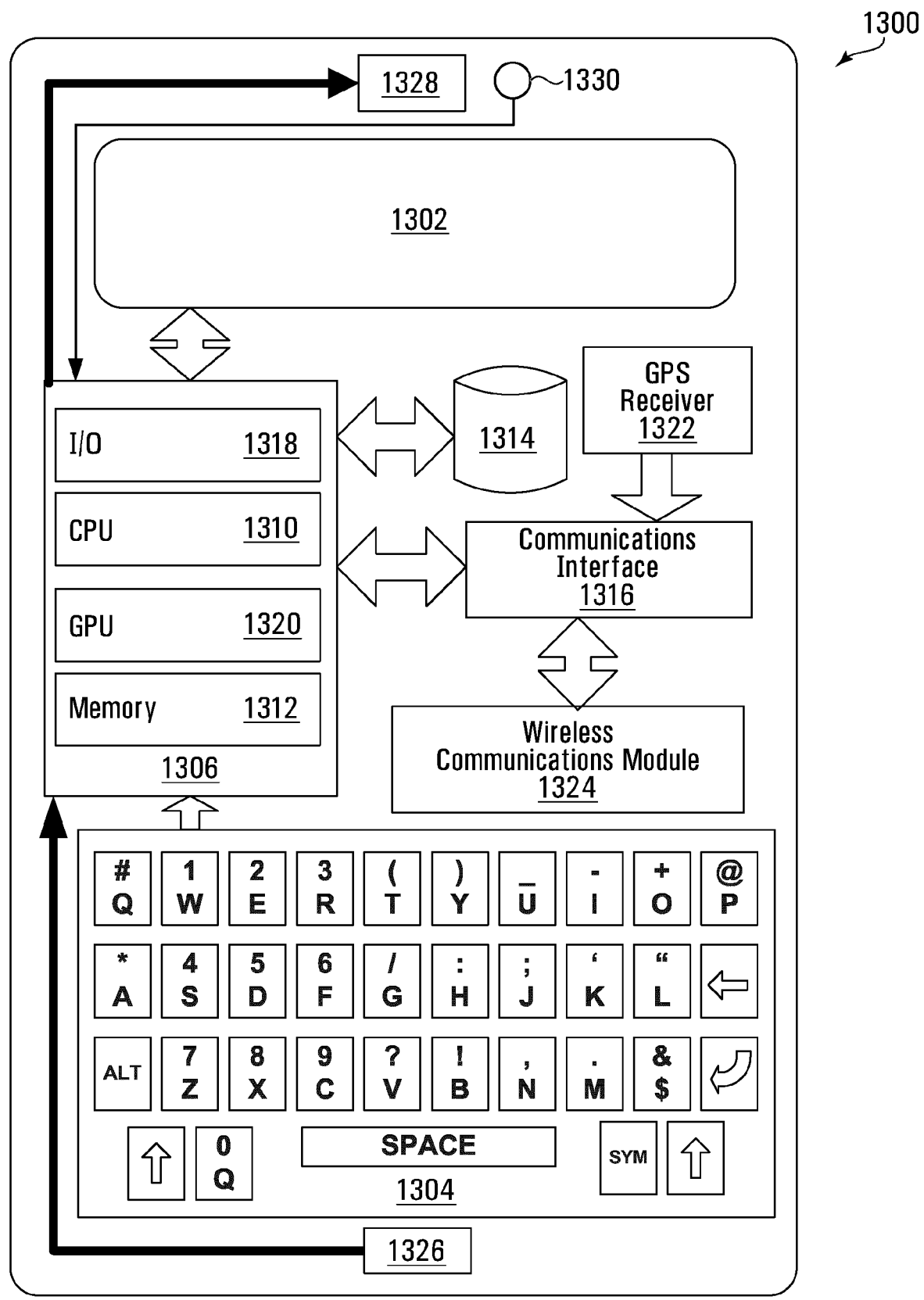

FIG. 13 shows an example networked mobile wireless telecommunication computing device in the form of the smartphone 1300. The smartphone 1300 may, for example, be used as the analysis device 124 or be used as a client to control the analysis device 124. The smartphone 1300 comprises a display 1302, an input device in the form of keyboard 1304, and an onboard computer system 1306. The display 1302 may be a touchscreen display and thereby serve as an additional input device, or as an alternative to the keyboard 1304. The onboard computer system 1306 comprises a CPU 1310 having one or more processors or microprocessors for performing arithmetic calculations and control functions to execute software stored in an internal memory 1312, such as one or both of RAM and ROM, is coupled to additional memory 1314 that typically comprises flash memory, which may be integrated into the smartphone 1300 or may comprise a removable flash card, or both. The smartphone 1300 also comprises wireless communication circuitry that allows software and data to be transferred between the smartphone 1300 and external systems and networks. In the example embodiment of FIG. 13, the wireless communication circuitry comprises one or more wireless communication modules 1324 communicatively coupled to a communications interface 1316, which for example comprises a wireless radio for connecting to one or more of a cellular network, a wireless digital network, and a WiFi™ network. The communications interface 1316 also enables a wired connection of the smartphone 1300 to an external computer system. A microphone 1326 and speaker 1328 are coupled to the onboard computer system 1306 to support the telephone functions managed by the onboard computer system 1306, and GPS receiver hardware 1322 may also be coupled to the communications interface 1316 to support navigation operations by the onboard computer system 1306. The smartphone 1300 also comprises a camera 1330 communicative with the onboard computer system 1306 for taking photos using the smartphone 1300. Input to and output from the onboard computer system 1306 is administered by an I/O interface 1318, which administers control of the display 1302, keyboard 1304, microphone 1326, speaker 1328, and camera 1330. The onboard computer system 1306 may also comprise a separate GPU 1320. The various components are coupled to one another either directly or by shared coupling to one or more suitable buses.

The term "computer system", as used herein, is not limited to any particular type of computer system and encompasses servers, desktop computers, laptop computers, networked mobile wireless telecommunication computing devices such as smartphones, tablet computers, as well as other types of computer systems.

As will be appreciated by one skilled in the art, embodiments of the technology described herein may be embodied as a system, method, or computer program product. Accordingly, these embodiments may take the form of an entirely hardware embodiment, an entirely software embodiment (including firmware, resident software, micro-code, etc.) or an embodiment combining software and hardware that may all generally be referred to herein as a "circuit," "module," or "system." Furthermore, embodiments of the presently described technology may take the form of a computer program product embodied in one or more non-transitory computer readable media having stored or encoded thereon computer readable program code.

Where aspects of the technology described herein are implemented as a computer program product, any combination of one or more computer readable media may be utilized. A computer readable medium may comprise a computer readable signal medium or a non-transitory computer readable medium used for storage. A non-transitory computer readable medium may comprise, for example, an electronic, magnetic, optical, electromagnetic, infrared, or semiconductor system, apparatus, or device, or any suitable combination thereof. Additional examples of non-transitory computer readable media comprise a portable computer diskette, a hard disk, RAM, ROM, an erasable programmable read-only memory ("EPROM" or "flash memory"), a portable compact disc read-only memory ("CD-ROM"), an optical storage device, a magnetic storage device, or any suitable combination thereof. As used herein, a non-transitory computer readable medium may comprise any tangible medium that can contain, store, or have encoded thereon a program for use by or in connection with an instruction execution system, apparatus, or device. Thus, computer readable program code for implementing aspects of the embodiments described herein may be contained, stored, or encoded on the memory 1312 of the onboard computer system 1306 of the smartphone 1300 or the memory 1212 of the computer 1206, or on a computer readable medium external to the onboard computer system 1306 of the smartphone 1300 or the computer 1206, or on any combination thereof; the onboard computer system 1306 may thereby be configured to perform those embodiments.

Program code embodied on a computer readable medium may be transmitted using any appropriate medium, including but not limited to wireless, wireline, optical fiber cable, radiofrequency, and the like, or any suitable combination thereof. Computer program code for carrying out operations comprising part of the embodiments described herein may be written in any combination of one or more programming languages, including an object oriented programming language and procedural programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (e.g., through the Internet using an Internet Service Provider).

The terminology used herein is for the purpose of describing particular embodiments only and is not intended to be limiting. Accordingly, as used herein, the singular forms "a", "an" and "the" are intended to include the plural forms as well, unless the context clearly indicates otherwise. It will be further understood that the terms "comprises" and "comprising," when used in this specification, specify the presence of one or more stated features, integers, steps, operations, elements, and components, but do not preclude the presence or addition of one or more other features, integers, steps, operations, elements, components, and groups. Directional terms such as "top", "bottom", "upwards", "downwards", "vertically", and "laterally" are used in the following description for the purpose of providing relative reference only, and are not intended to suggest any limitations on how any article is to be positioned during use, or to be mounted in an assembly or relative to an environment. Additionally, the term "couple" and variants of it such as "coupled", "couples", and "coupling" as used in this description are intended to include indirect and direct connections unless otherwise indicated. For example, if a first device is coupled to a second device, that coupling may be through a direct connection or through an indirect connection via other devices and connections. Similarly, if the first device is communicatively coupled to the second device, communication may be through a direct connection or through an indirect connection via other devices and connections.

It is contemplated that any part of any aspect or embodiment discussed in this specification can be implemented or combined with any part of any other aspect or embodiment discussed in this specification.

One or more currently example embodiments have been described by way of illustration only. This description is been presented for purposes of illustration and description, but is not intended to be exhaustive or limited to the form disclosed. Many modifications and variations will be apparent to those of ordinary skill in the art without departing from the scope of the claims. It will be apparent to persons skilled in the art that a number of variations and modifications can be made without departing from the scope of the claims. In construing the claims, it is to be understood that the use of a computer to implement the embodiments described herein is essential at least where the presence or use of computer equipment is positively recited in the claims.

The invention claimed is:

1. A method for detecting at least one of an influx event and a loss event during well drilling, the method comprising:
   (a) determining, using a processor:
      (i) an estimated pit volume and an estimated flow out, wherein the estimated flow out comprises a sum of scaled and historical measured flow in readings, wherein weights used to scale the measured flow in readings are determined using the measured flow in readings measured during or around one or both of pump on and off transient events;
      (ii) a pit volume difference between the estimated pit volume and a measured pit volume;
      (iii) a flow out difference between the estimated flow out and a measured flow out;
      (iv) at least one of:
         (1) whether the magnitude of the pit volume difference exceeds a pit volume influx event threshold, the measured pit volume exceeds the estimated pit volume, the magnitude of the flow estimate difference exceeds a flow out influx event threshold, and the measured flow out exceeds the estimated flow out; and
         (2) whether the magnitude of the pit volume difference exceeds a pit volume loss event threshold, the estimated pit volume exceeds the measured pit volume, the magnitude of the flow out difference exceeds a flow out loss event threshold, and the estimated flow out exceeds the measured flow out;
   (b) when the processor determines that the magnitude of the pit volume difference exceeds the pit volume influx event threshold, the measured pit volume exceeds the estimated pit volume, the magnitude of the flow estimate difference exceeds the flow out influx event threshold, and the measured flow out exceeds the estimated flow out, identifying the influx event as occurring; and
   (c) when the processor determines that the magnitude of the pit volume difference exceeds the pit volume loss event threshold, the estimated pit volume exceeds the measured pit volume, the magnitude of the flow out difference exceeds the flow out loss event threshold, and the estimated flow out exceeds the measured flow out, identifying the loss event as occurring.

2. The method of claim 1 wherein determining using the processor, step (iv) comprises the processor determining whether the magnitude of the pit volume difference exceeds the pit volume influx event threshold, the measured pit volume exceeds the estimated pit volume, the magnitude of the flow estimate difference exceeds the flow out influx event threshold, and the measured flow out exceeds the estimated flow out, and not determining whether the magnitude of the pit volume difference exceeds the pit volume loss event threshold, the estimated pit volume exceeds the measured pit volume, the magnitude of the flow out difference exceeds the flow out loss event threshold, and the estimated flow out exceeds the measured flow out.

3. The method of claim 1 wherein determining, using the processor, step (iv) comprises the processor determining whether the magnitude of the pit volume difference exceeds the pit volume loss event threshold, the estimated pit volume exceeds the measured pit volume, the magnitude of the flow out difference exceeds the flow out loss event threshold, and the estimated flow out exceeds the measured flow out, and not determining whether the magnitude of the pit volume difference exceeds the pit volume influx event threshold, the measured pit volume exceeds the estimated pit volume, the magnitude of the flow estimate difference exceeds the flow out influx event threshold, and the measured flow out exceeds the estimated flow out.

4. The method of claim 1 wherein determining, using the processor, step (iv) comprises the processor determining whether the magnitude of the pit volume difference exceeds the pit volume influx event threshold, the measured pit volume exceeds the estimated pit volume, the magnitude of the flow estimate difference exceeds the flow out influx event threshold, and the measured flow out exceeds the estimated flow out, and determining whether the magnitude of the pit volume difference exceeds the pit volume loss event threshold, the estimated pit volume exceeds the measured pit volume, the magnitude of the flow out difference exceeds the flow out loss event threshold, and the estimated flow out exceeds the measured flow out.

5. The method of claim 1 wherein the weights are determined as a time sensitive regression from the measured flow in readings measured within five minutes of one or both of the pump on and off transient events.

6. The method of claim 1 wherein the estimated flow out further comprises a sum of scaled and historical readings of changes with respect to time of a difference between hole depth and bit depth.

7. The method of claim 6 wherein weights used to scale the readings of changes with respect to time of the difference between hole depth and bit depth are determined using a time sensitive regression and within five minutes of events during which bit depth changes while hole depth stays constant.

8. The method of claim 1 wherein the processor determines the estimated pit volume by applying a time sensitive regression.

9. The method of claim 1 wherein the processor determines the estimated pit volume by applying a depth sensitive regression.

10. The method of claim 1 wherein the processor determines the estimated pit volume by applying a time and depth sensitive regression.

11. The method of claim 10 wherein:
(a) the estimated pit volume is determined as a sum of the depth sensitive regression and the time sensitive regression;
(b) each of the depth and time sensitive regressions is linear;
(c) the depth sensitive regression is determined from historical measurements of hole depth and the pit volume; and
(d) the time sensitive regression is determined from historical values of the depth sensitive regression.

12. The method of claim 8 wherein the time sensitive regression is linear and determined from historical measurements of the pit volume.

13. The method of claim 1 wherein the processor determines the estimated pit volume as a value less than or equal to a trailing median of the measured pit volume, and the processor uses the estimated pit volume to identify the influx event as occurring.

14. The method of claim 1 wherein the processor determines the estimated pit volume as a value greater than or equal to a trailing median of the measured pit volume, and the processor uses the estimated pit volume to identify the loss event as occurring.

15. The method of claim 1 wherein the processor determines the estimated pit volume as comprising a difference between a sum of historical flow out measurements and a sum of historical flow in measurements.

16. The method of claim 15 wherein the flow in measurements that are summed are compensated for a time for a drilling fluid to travel from a mud tank to an input flow meter and the time for drilling fluid to exit the mud tank as a result of a stroke of a mud pump.

17. The method of claim 15 wherein the flow out measurements that are summed are compensated for a time for a drilling fluid to travel from a return flow meter to a mud tank.

18. The method of claim 15 wherein the historical flow in and flow out measurements correspond to flow in and flow out within five minutes of one or both of pump on and off transient events.

19. The method of claim 15 wherein the processor determines the estimated pit volume by:
(a) determining a sum of scaled and historical measured readings of changes with respect to time of flow in, wherein weights used to scale the readings of changes with respect to time of flow in are determined from the measured flow in readings measured during or around one or both of the pump on and off transient events; and
(b) summing the sum of scaled and historical measured readings of changes with respect to time of flow in to determine the estimated pit volume.

20. The method of claim 19 wherein the weights are determined using a time sensitive regression from measured flow in readings measured within five minutes of one or both of the pump on and off transient events.

21. A non-transitory computer readable medium having encoded thereon program code that is executable by a processor and that, when executed, causes the processor to perform a method for detecting at least one of an influx event and a loss event during well drilling, the method comprising:
(a) determining, using the processor:
(i) an estimated pit volume and an estimated flow out, wherein the estimated flow out comprises a sum of scaled and historical measured flow in readings, wherein weights used to scale the measured flow in readings are determined using the measured flow in readings measured during or around one or both of pump on and off transient events;
(ii) a pit volume difference between the estimated pit volume and a measured pit volume;
(iii) a flow out difference between the estimated flow out and a measured flow out;

(iv) at least one of:
- (1) whether the magnitude of the pit volume difference exceeds a pit volume influx event threshold, the measured pit volume exceeds the estimated pit volume, the magnitude of the flow estimate difference exceeds a flow out influx event threshold, and the measured flow out exceeds the estimated flow out; and
- (2) whether the magnitude of the pit volume difference exceeds a pit volume loss event threshold, the estimated pit volume exceeds the measured pit volume, the magnitude of the flow out difference exceeds a flow out loss event threshold, and the estimated flow out exceeds the measured flow out;

(b) when the processor determines that the magnitude of the pit volume difference exceeds the pit volume influx event threshold, the measured pit volume exceeds the estimated pit volume, the magnitude of the flow estimate difference exceeds the flow out influx event threshold, and the measured flow out exceeds the estimated flow out, identifying the influx event as occurring; and (c) when the processor determines that the magnitude of the pit volume difference exceeds the pit volume loss event threshold, the estimated pit volume exceeds the measured pit volume, the magnitude of the flow out difference exceeds the flow out loss event threshold, and the estimated flow out exceeds the measured flow out, identifying the loss event as occurring.

* * * * *